(12) United States Patent
Hiramatsu et al.

(10) Patent No.: US 7,105,419 B2
(45) Date of Patent: Sep. 12, 2006

(54) THIN-FILM SEMICONDUCTOR SUBSTRATE, METHOD OF MANUFACTURING THIN-FILM SEMICONDUCTOR SUBSTRATE, METHOD OF CRYSTALLIZATION, APPARATUS FOR CRYSTALLIZATION, THIN-FILM SEMICONDUCTOR DEVICE, AND METHOD OF MANUFACTURING THIN-FILM SEMICONDUCTOR DEVICE

(75) Inventors: Masato Hiramatsu, Yokohama (JP); Yoshinobu Kimura, Yokohama (JP); Hiroyuki Ogawa, Yokohama (JP); Masayuki Jyumonji, Yokohama (JP); Masakiyo Matsumura, Yokohama (JP)

(73) Assignee: Advanced LCD Technologies Development Center Co., Ltd., Yokohama (JP)

( * ) Notice: Subject to any disclaimer, the term of this patent is extended or adjusted under 35 U.S.C. 154(b) by 0 days.

(21) Appl. No.: 10/879,165

(22) Filed: Jun. 30, 2004

(65) Prior Publication Data

US 2005/0012228 A1    Jan. 20, 2005

(30) Foreign Application Priority Data

Jul. 16, 2003    (JP) .............................. 2003-197824

(51) Int. Cl.
*H01L 21/30* (2006.01)
*H01L 21/76* (2006.01)
*H01L 21/46* (2006.01)

(52) U.S. Cl. ...................... 438/401; 438/462; 438/975; 438/166

(58) Field of Classification Search ................ 438/401, 438/462, 975, 150, 166
See application file for complete search history.

(56) References Cited

U.S. PATENT DOCUMENTS

| | | | |
|---|---|---|---|
| 6,727,025 B1 * | 4/2004 | Shiraishi | 430/5 |
| 2003/0071312 A1 | 4/2003 | Oana et al. | |
| 2003/0103196 A1 * | 6/2003 | Hirukawa | 355/55 |
| 2003/0147594 A1 * | 8/2003 | Stayt et al. | 385/52 |
| 2005/0040412 A1 * | 2/2005 | Kokubo et al. | 257/85 |

OTHER PUBLICATIONS

"Flat Panel Display", 1996, pp. 174-176.
Masakiyo Matsumura, "Preparation of Ultra-Large Grain Silicon Thin-Films by Excimer-Laser", Journal of the surface Science Society of Japan, vol. 21, No. 5, 2000, pp. 278-287.
Mitsuru Nakata, et al., "A New Nucleation-Site-Control Excimer-Laser-Crystallization Method", Jpn. J. Appl. Phys., vol. 40, Part 1, No. 5A, May 2001, pp. 3049-3054.
Chang-Ho, Oh, et al., "Preparation of Position-Controlled Crystal-Silicon Island Arrays by Means of Excimer-Laser Annealing", Jpn. J. Appl. Phys., vol. 37, Part 1, No. 10, Oct. 1998, pp. 5474-5479.
* cited by examiner

*Primary Examiner*—Nitin Parekh
(74) *Attorney, Agent, or Firm*—Oblon, Spivak, McClelland, Maier & Neustadt, P.C.

(57) ABSTRACT

A thin-film semiconductor substrate includes an insulative substrate, an amorphous semiconductor thin film that is formed on the insulative substrate, and a plurality of alignment marks that are located on the semiconductor thin film and are indicative of reference positions for crystallization.

11 Claims, 18 Drawing Sheets

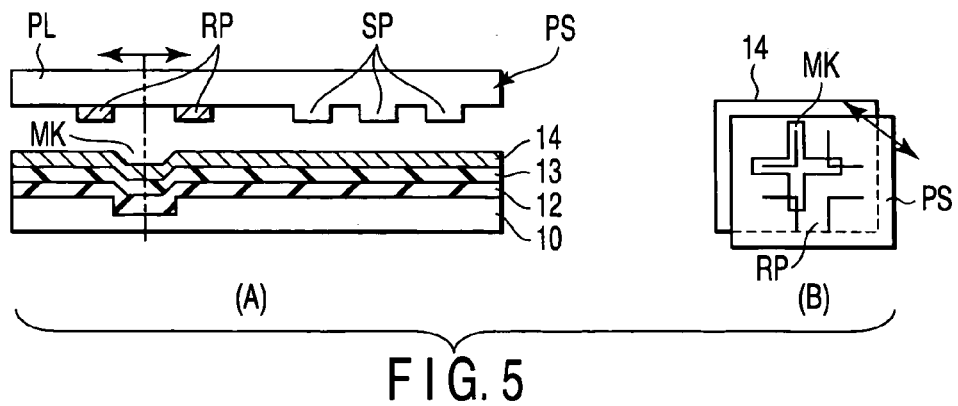
F I G. 5
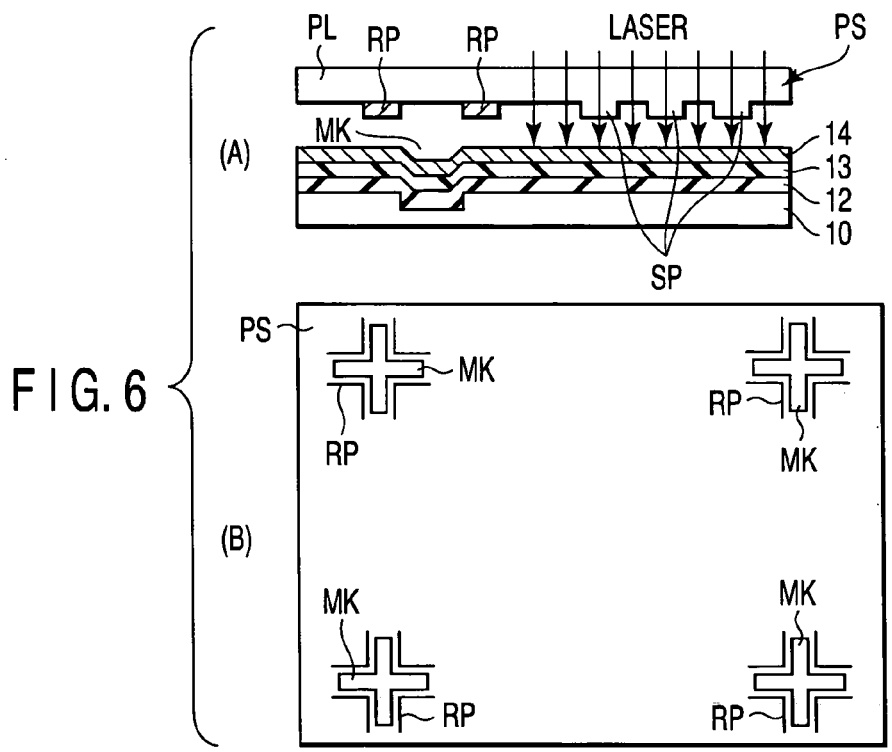
F I G. 6
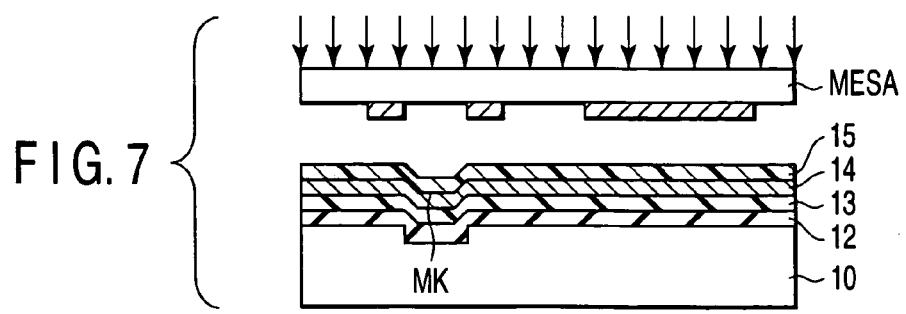
F I G. 7

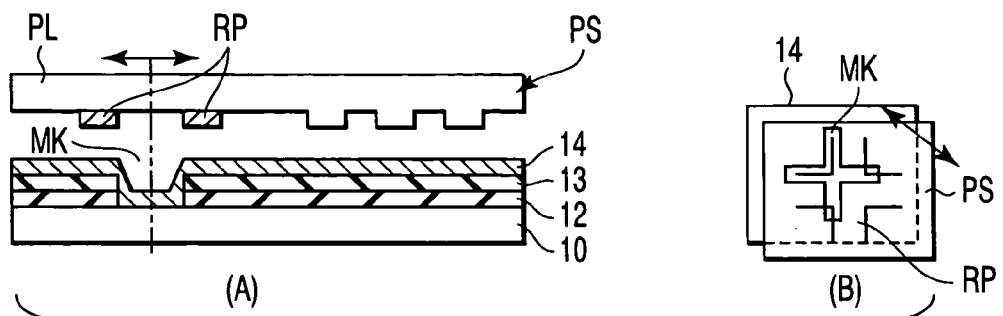
F I G. 3 5
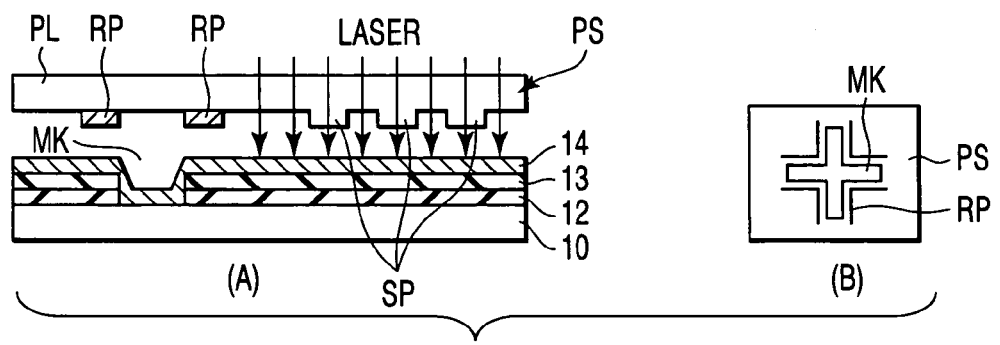
F I G. 3 6
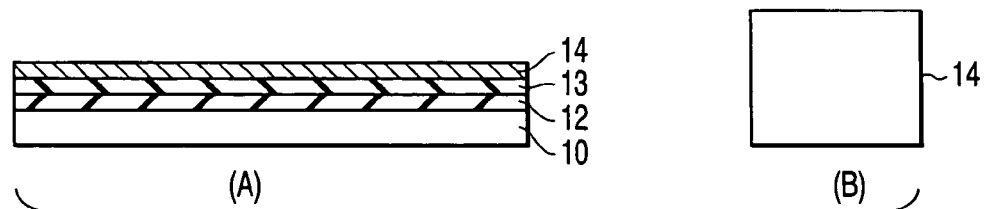
F I G. 3 7
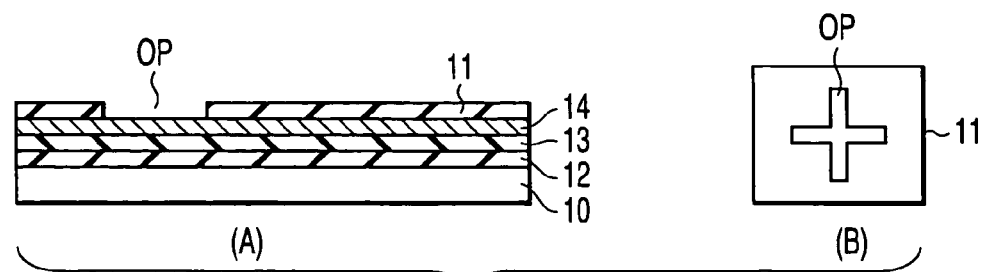
F I G. 3 8

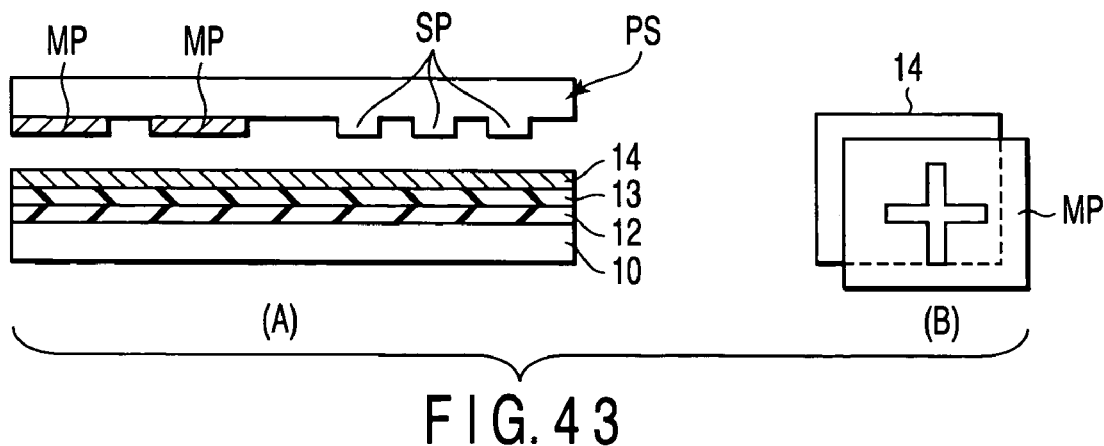
F I G. 43
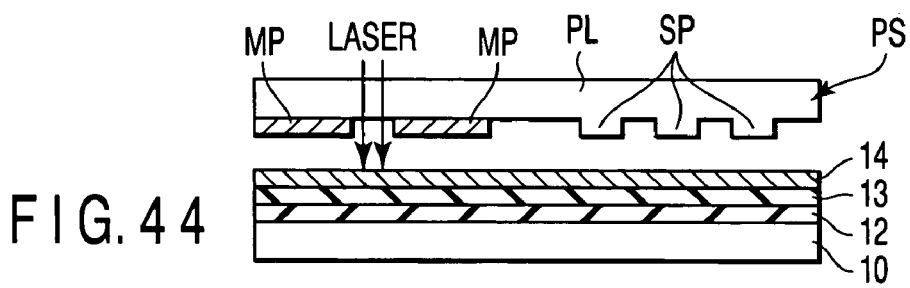
F I G. 44
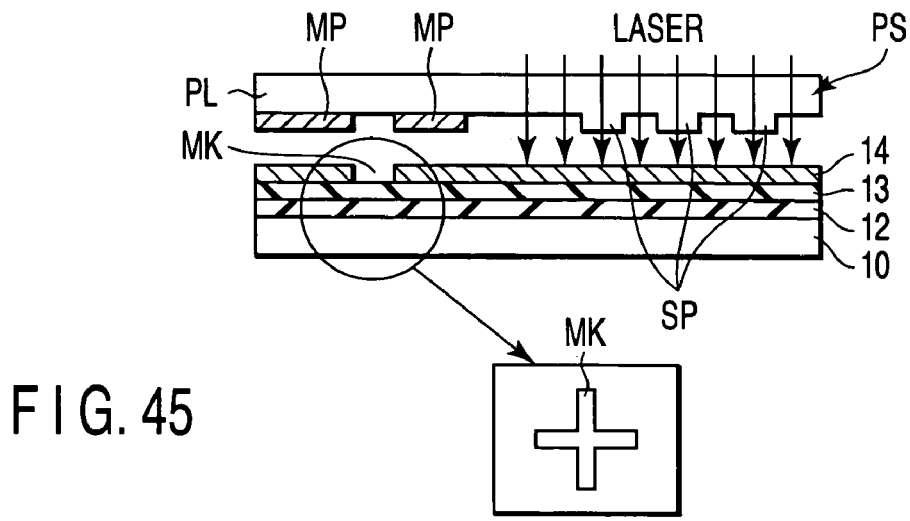
F I G. 45
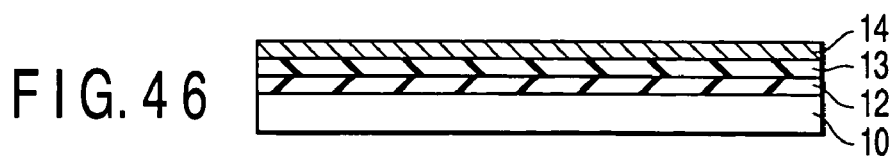
F I G. 46

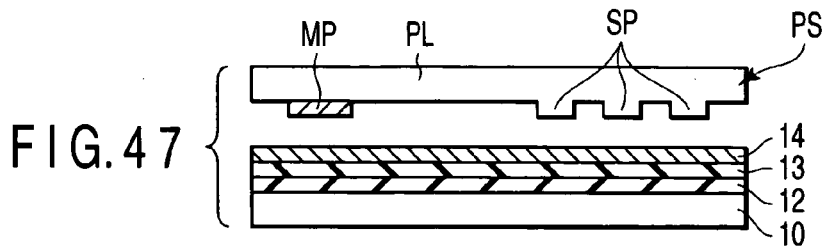
FIG. 47
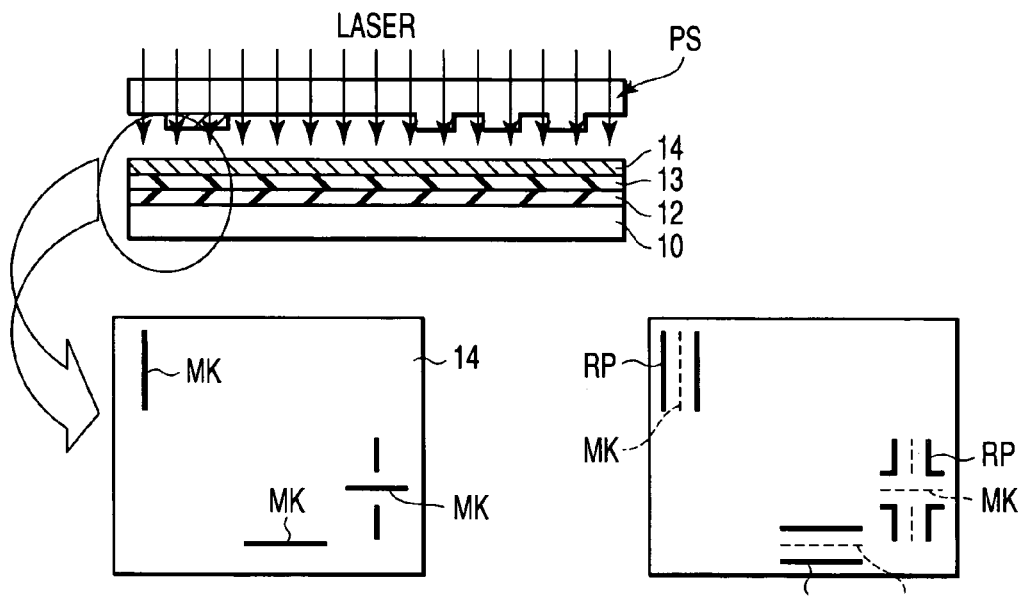
FIG. 48
FIG. 49
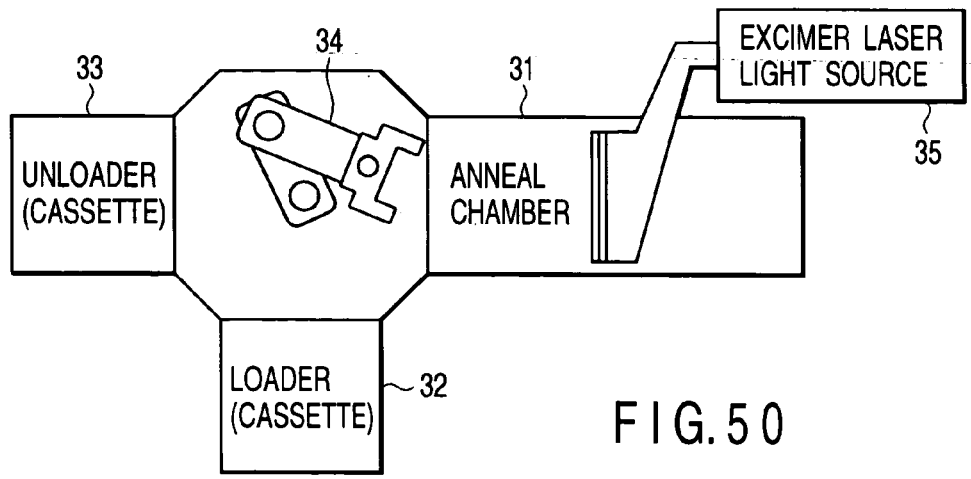
FIG. 50

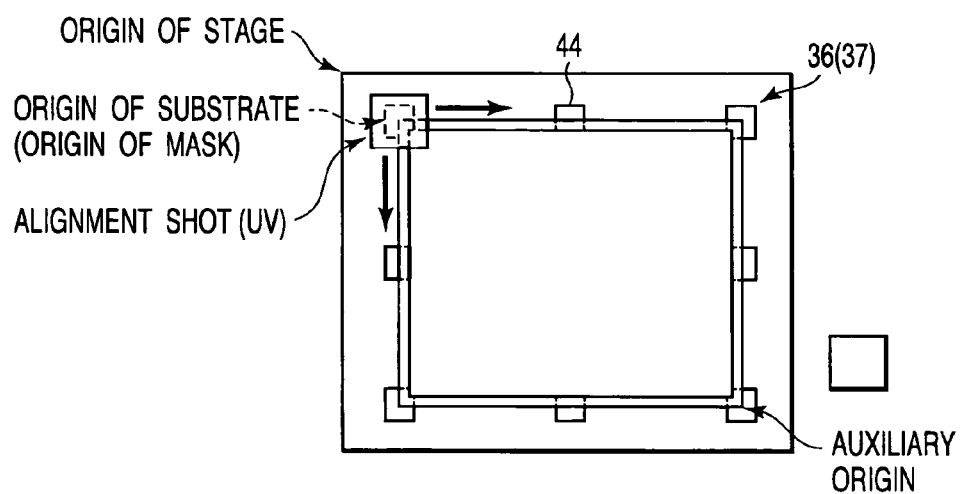
FIG. 59
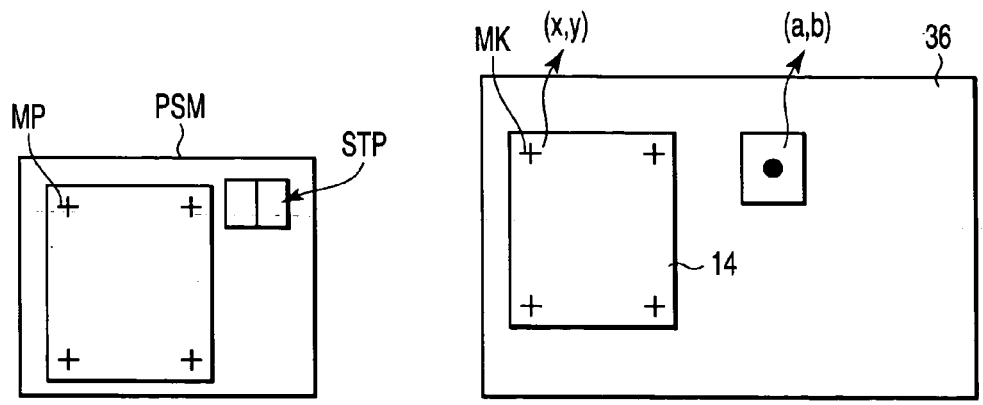
FIG. 61
FIG. 62

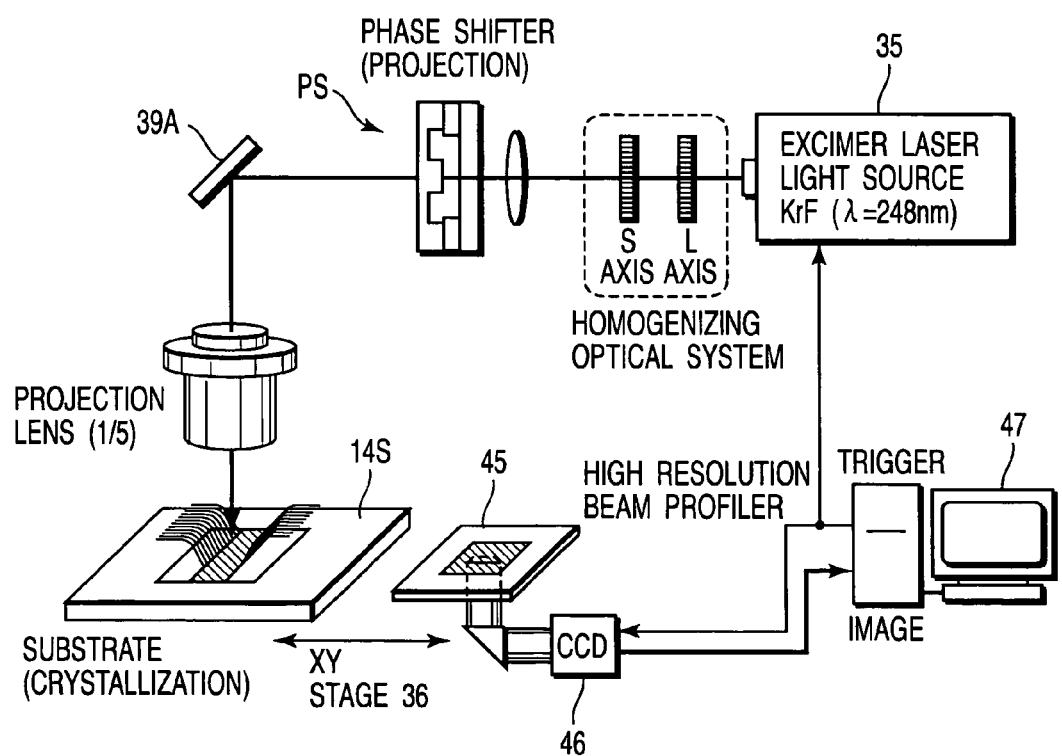
F I G. 60

THIN-FILM SEMICONDUCTOR SUBSTRATE, METHOD OF MANUFACTURING THIN-FILM SEMICONDUCTOR SUBSTRATE, METHOD OF CRYSTALLIZATION, APPARATUS FOR CRYSTALLIZATION, THIN-FILM SEMICONDUCTOR DEVICE, AND METHOD OF MANUFACTURING THIN-FILM SEMICONDUCTOR DEVICE

CROSS-REFERENCE TO RELATED APPLICATIONS

This application is based upon and claims the benefit of priority from prior Japanese Patent Application No. 2003-197824, filed Jul. 16, 2003, the entire contents of which are incorporated herein by reference.

BACKGROUND OF THE INVENTION

1. Field of the Invention

The present invention relates to a thin-film semiconductor substrate, a method of manufacturing a thin-film semiconductor substrate, a method of crystallization, an apparatus for crystallization, a thin-film semiconductor device, and a method of manufacturing a thin-film semiconductor device, which are applicable to, for instance, an active matrix flat panel display.

2. Description of the Related Art

Thin-film semiconductor technology is important in forming semiconductor devices, such as a thin-film transistor (TFT: Thin-Film Transistor), a contact image sensor and a photoelectric conversion device, on an insulative substrate. The thin-film transistor is a MOS (MIS) field-effect transistor and is applied to a flat panel display such as a liquid crystal display (see, e.g. non-patent document 1: "Flat Panel Display 96", pp. 174–176).

In general terms, a liquid crystal display is characterized by thinness, lightness, low power consumption, and easy display in color. For these features, liquid crystal displays are widely applied to displays of personal computers or various portable information terminals. In the case where a liquid crystal display is of an active matrix type, thin-film transistors are provided as pixel switching elements.

An active layer (carrier drift layer) of the thin-film transistor is formed of, e.g. a silicon semiconductor thin film. Silicon semiconductor thin films fall into two categories: amorphous silicon (a-Si) and polycrystalline silicon (non-single-crystal crystalline silicon) with a crystal phase. The polycrystalline silicon is mainly polysilicon (poly-Si). Microcrystal silicon ($\mu$c-Si) is also known as polycrystalline silicon. Examples of semiconductor thin-film material, other than silicon, include SiGe, SiO, CdSe, Te, and CdS.

The carrier mobility of polycrystalline silicon is about 10 times to 100 times greater than that of amorphous silicon. This characteristic is very excellent as that of semiconductor thin-film material of switching devices. In recent years, attention has been paid to the thin-film transistor having an active layer formed of polysilicon, since it has high operation speed and is a switching device that can constitute various logic circuits such as a domino circuit and a CMOS transmission gate. This logic circuit is required in forming a drive circuit, a multiplexer, an EPROM, an EEPROM, a CCD and a RAM in a liquid crystal display device and an electro-luminescence display device.

A typical conventional process of fabricating a polycrystalline silicon semiconductor thin film will now be described. In this process, an insulative substrate of glass, etc. is first prepared. A silicon oxide film ($SiO_2$), for instance, is formed as an undercoat layer (or buffer layer) on the insulative substrate. An amorphous silicon film (a-Si) with a thickness of about 50 mm is formed as a semiconductor thin film on the undercoat layer. Then, dehydrogenation is conducted to lower the hydrogen content in the amorphous silicon film. Subsequently, the amorphous silicon film is melted and recrystallized by, for instance, an excimer layer crystallization method. Specifically, an excimer laser beam is applied to the amorphous silicon film, thereby changing the amorphous silicon into polycrystalline silicon.

At present, the semiconductor thin film of the thus obtained polycrystalline silicon is used as an active layer of an n-channel or a p-channel thin-film transistor. In this case, the field-effect mobility of the thin-film transistor (the mobility of electrons or holes by field effect) is about 100 to 150 $cm^2$/Vsec in the case of the n-channel thin-film transistor and is 100 $cm^2$/Vsec in the case of the p-channel thin-film transistor. The use of such thin-film transistors makes it possible to obtain a driver-circuit-integrated display device wherein driver circuits such as a signal line drive circuit and a scanning line drive circuit are simultaneously formed along with pixel switching elements on the same substrate. The manufacturing cost of the display device can thus be reduced.

The electrical characteristics of present-day thin-film transistors are not so excellent that signal processing circuits, such as a D/A converter for converting digital video data to analog video signals and a gate array for processing digital video data, are integrated on the substrate of the display device. To achieve this, the thin-film transistor needs to have a current driving ability that is twice to five times higher than that of the present-day device. Further, the field-effect mobility needs to be about 300 $cm^2$/Vsec or more. The electrical characteristics of the thin-film transistor need to be further enhanced in order to increase the functional performance of the display device and to enhance the added values. In the case where a static memory that comprises a thin-film transistor is added to each pixel, for example, in order to provide a memory function, the thin-film transistor needs to have electrical characteristics that are substantially equal to those of single-crystal semiconductor. Therefore, it is important that the characteristics of the semiconductor be enhanced.

As a means for enhancing the characteristics of the semiconductor thin film, it can be thought, for example, that the crystallinity of semiconductor thin film is made closer to that of a single crystal. In fact, if the entire semiconductor thin film on the insulative substrate can be made into a single crystal, it becomes possible to obtain characteristics that are substantially equal to those of a device using an SOI substrate, which is considered to be the next-generation LSI. This attempt was first made more than ten years ago as a 3D device research project, but technology for making the entire semiconductor thin film into a single crystal is yet to be established. Even at present, it is hopefully expected that the semiconductor grain in the semiconductor thin film is a single crystal.

In the prior art, techniques for growing a single-crystal semiconductor grain to a large size in the crystallization of an amorphous semiconductor thin film have been proposed (see, for instance, non-patent document 2: Journal of the Surface Science Society of Japan, Vol. 21, No. 5, pp. 278–287). Non-patent document 2 was published as an achievement of the research that had been energetically continued by Matsumura, et al. Non-patent document 2 discloses a phase-modulation excimer laser crystallization method wherein an excimer laser beam that is spatially intensity-modulated by a phase shifter is applied to an amorphous silicon thin film, thereby melting and recrystallizing the amorphous silicon thin film into a polysilicon thin film. In an ordinary laser crystallization method, an optical system that is referred to as "beam homonizer" is employed to uniformize the excimer laser intensity on the plane of the silicon thin film. On the other hand, according to the scheme of the phase-modulation excimer laser crystallization method, the excimer laser intensity on the plane of the silicon thin film is varied to have high and low levels by the phase shifter, and a temperature gradient corresponding to the resultant intensity distribution is provided in the silicon thin film. The temperature gradient promotes growth of a single-crystal silicon grain from a low-temperature region to a high-temperature region in a lateral direction that is parallel to the plane of the silicon thin film. As a result, compared to the prior-art laser crystallization method, a single-crystal silicon grain can be grown to a larger size. Specifically, the single-crystal silicon grain can be grown to a size of several microns, which can contain an active device such as a thin-film transistor. Therefore, it is reasonable to think that a thin-film transistor with electrical characteristics, which can meet the above-mentioned requirements, can be obtained by forming the thin-film transistor in this single-crystal silicon grain.

As stated above, the phase-modulation excimer laser crystallization method is effective in obtaining the large-size single-crystal silicon grain. However, as described in non-patent document 2, the large-size single-crystal silicon grain is surrounded by polysilicon or amorphous silicon, which is a countless number of small-size single-crystal silicon grains. If the thin-film transistor is formed with a displacement from the range of the large-size single-crystal silicon grain, the electrical characteristics of the thin-film transistor would considerably be degraded. If such a thin-film transistor is included in a product such as a flat panel display, the display would become a defective one.

In the prior-art, even if a glass substrate, which is covered with an amorphous silicon thin film, is placed at such a predetermined position as to face a phase shifter in a crystallization process for crystallizing the amorphous silicon thin film, the following problem would arise. That is, in a process subsequent to the crystallization process, a thin-film transistor, which is to be formed in the silicon thin film, cannot exactly be positioned within the range of the large-size single-crystal silicon grain.

BRIEF SUMMARY OF THE INVENTION

The object of the present invention is to provide a thin-film semiconductor substrate, a method of manufacturing a thin-film semiconductor substrate, a crystallization method, a crystallization apparatus, a thin-film semiconductor device, and a method of manufacturing a thin-film semiconductor device, which are highly reliable in the case of forming a semiconductor active device in the range of such a large-size single-crystal semiconductor grain as is obtained by a phase-modulation excimer laser crystallization method.

According to a first aspect of the present invention, there is provided a thin-film semiconductor substrate comprising an insulative substrate, an amorphous semiconductor thin film that is formed on the insulative substrate, and a plurality of alignment marks that are located on the semiconductor thin film and are indicative of reference positions for crystallization.

According to a second aspect of the present invention, there is provided a method of manufacturing a thin-film semiconductor substrate, comprising: forming an amorphous semiconductor thin film on an insulative substrate; and providing a plurality of alignment marks located on the semiconductor thin film, the alignment marks being indicative of reference positions for crystallization.

According to a third aspect of the present invention, there is provided a crystallization method comprising: forming a thin-film semiconductor substrate including an insulative substrate, an amorphous semiconductor thin film that is formed on the insulative substrate, and a plurality of alignment marks that are located on the semiconductor thin film and are indicative of reference positions for crystallization; and applying a laser beam for crystallization to the semiconductor thin film through a phase shifter that is aligned with the reference positions for crystallization.

According to a fourth aspect of the present invention, there is provided a crystallization apparatus comprising: a substrate stage for mounting of a thin-film semiconductor substrate including an insulative substrate, an amorphous semiconductor thin film that is formed on the insulative substrate, and a plurality of alignment marks that are located on the semiconductor thin film and are indicative of reference positions for crystallization; and a laser irradiation section that applies a laser beam for crystallization to the semiconductor thin film through a phase shifter that is aligned with the reference positions for crystallization.

According to a fifth aspect of the present invention, there is provided a thin-film semiconductor device comprising: an insulative substrate; a polycrystalline semiconductor thin film formed on the insulative substrate; and a semiconductor active device; wherein the polycrystalline semiconductor thin film includes at least one single-crystal semiconductor grain along with a plurality of alignment marks having a predetermined positional relationship with the single-crystal semiconductor grain, the single-crystal semiconductor grain has a predetermined grain size to accommodate the semiconductor active device, and the semiconductor active device is located in a range of the single-crystal semiconductor grain with reference to the alignment marks.

According to a sixth aspect of the present invention, there is provided a method of manufacturing a thin-film semiconductor device, comprising: forming on an insulative substrate a polycrystalline semiconductor thin film that includes at least one single-crystal semiconductor grain along with a plurality of alignment marks having a predetermined positional relationship with the single-crystal semiconductor grain; and forming a semiconductor active device; wherein the single-crystal semiconductor grain has a predetermined grain size to accommodate the semiconductor active device, and the semiconductor active device is located in a range of the single-crystal semiconductor grain with reference to the alignment marks.

As regards the above-described thin-film semiconductor substrate, method of manufacturing a thin-film semiconductor substrate, crystallization method, crystallization apparatus, thin-film semiconductor device and method of manufacturing a thin-film semiconductor device, a plurality of alignment marks are provided on the semiconductor thin film. The alignment marks function as reference positions for determining the mask position in the case of crystallizing the semiconductor thin film or the mask position in the case of forming the semiconductor active device in the semiconductor thin film. Therefore, the semiconductor active device can be formed with high reliability in the range of the large-size single-crystal semiconductor grain that is obtained by crystallizing the semiconductor thin film.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

FIG. 5 is a view illustrating a fabrication step of the polysilicon TFT, following the step shown in FIG. 4;

FIG. 6 is a view illustrating a fabrication step of the polysilicon TFT, following the step shown in FIG. 5;

FIG. 7 is a view illustrating a fabrication step of the polysilicon TFT, following the step shown in FIG. 6;

FIG. 35 is a view illustrating a fabrication step of the polysilicon TFT, following the step shown in FIG. 34;

FIG. 36 is a view illustrating a fabrication step of the polysilicon TFT, following the step shown in FIG. 35;

FIG. 37 is a view illustrating a fabrication step of a polysilicon TFT that is a thin-film semiconductor device according to a third embodiment of the present invention;

FIG. 38 is a view illustrating a fabrication step of the polysilicon TFT, following the step shown in FIG. 37;

FIG. 43 is a view illustrating a fabrication step of the polysilicon TFT, following the step shown in FIG. 42;

FIG. 44 is a view illustrating a fabrication step of the polysilicon TFT, following the step shown in FIG. 43;

FIG. 45 is a view illustrating a fabrication step of the polysilicon TFT, following the step shown in FIG. 44;

FIG. 46 is a view illustrating a fabrication step of a polysilicon TFT that is a thin-film semiconductor device according to a fifth embodiment of the present invention;

FIG. 47 is a view illustrating a fabrication step of the polysilicon TFT, following the step shown in FIG. 46;

FIG. 48 is a view illustrating a fabrication step of the polysilicon TFT, following the step shown in FIG. 47;

FIG. 49 shows reticle patterns that are provided on a photomask in accordance with alignment marks obtained in the step of FIG. 48;

FIG. 50 shows a schematic structure of a transfer robot that transfers a thin-film semiconductor substrate into and out of a laser crystallization apparatus according to a sixth embodiment of the present invention;

FIG. 59 shows a plurality of position sensors that are buried in a substrate stage and a mask stage;

FIG. 60 shows an example of a projection-type laser crystallization apparatus;

FIG. 61 shows a phase shifter that is used in the laser crystallization apparatus shown in FIG. 60;

FIG. 62 is a view for describing a method of determining the position of the substrate stage, using the phase shifter shown in FIG. 61.

DETAILED DESCRIPTION OF THE INVENTION

A thin-film semiconductor device according to a first embodiment of the present invention will now be described with reference to the accompanying drawings. This thin-film semiconductor device is a thin-film transistor (TFT) that is a semiconductor active device constituting, e.g. a pixel switching element array, a drive circuit, a D/A (digital-to-analog) converter, etc. of an active matrix liquid crystal display device. FIG. 1 to FIG. 23 illustrate successive fabrication steps for manufacturing, e.g. a polysilicon TFT. Portions (A) in FIGS. 1 to 6 are partial cross-sectional views, and portions (B) in FIGS. 1 to 6 are partial plan views.

Figure 1:
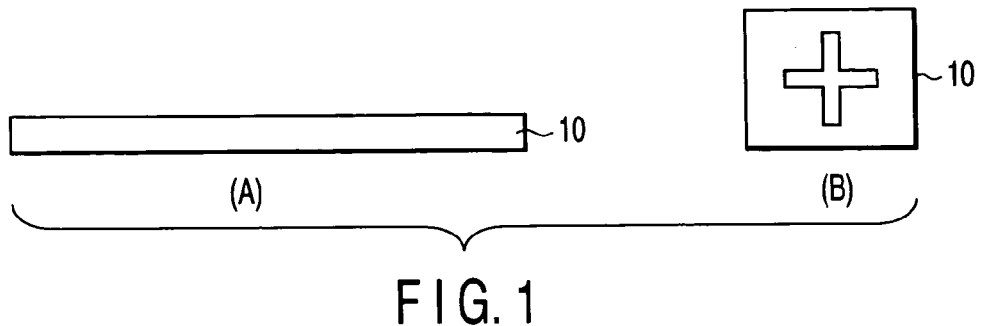
FIG. 1 is a cross-sectional view illustrating a fabrication step of a polysilicon TFT that is a thin-film semiconductor device according to a first embodiment of the present invention.

In a step shown in portions (A) and (B) of FIG. 1, an insulative substrate 10 of, e.g. quartz or no-alkali glass is prepared. The insulative substrate 10 is subjected to pretreatment of, e.g. scrubber washing or immersion in hydrofluoric acid. In this example, the insulative substrate 10 is formed of Corning #1737 glass.

Figure 2:
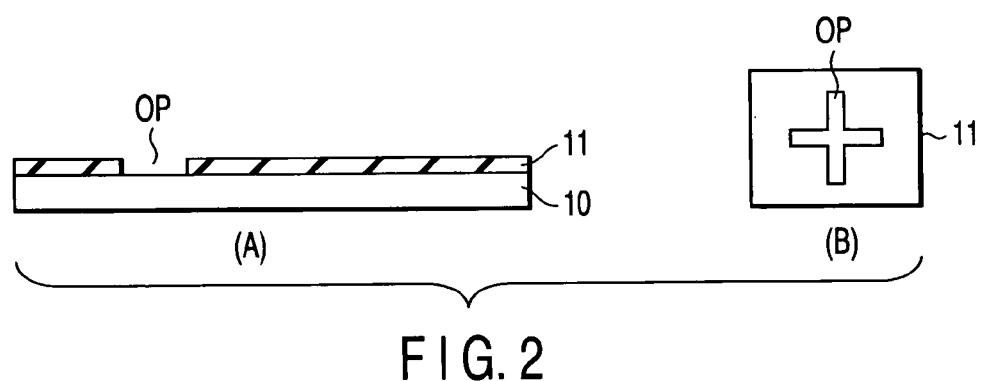
FIG. 2 is a view illustrating a fabrication step of the polysilicon TFT, following the step shown in FIG. 1.

In a step shown in portions (A) and (B) in FIG. 2, a resist material is coated on the insulative substrate 10. The resist material is selectively exposed using a photomask. The exposed part is removed and developed into a resist pattern 11, which is left on the insulative substrate 10. The resist pattern 11 has a plurality of openings OP each having, e.g. a "+" shape as shown in portion (B) of FIG. 2. The insulative substrate 10 is exposed at the openings OP. In portions (A) and (B) in FIG. 2, only one of the openings OP is shown.

Figure 3:
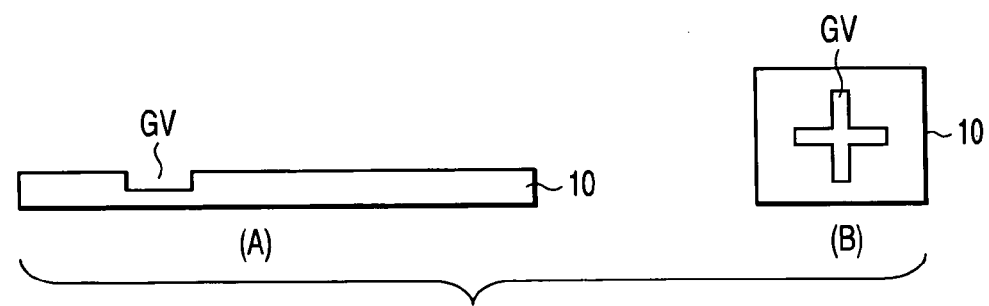
FIG. 3 is a view illustrating a fabrication step of the polysilicon TFT, following the step shown in FIG. 2.

In a step illustrated in portions (A) and (B) in FIG. 3, the insulative substrate 10 is subjected to reactive ion etching (RIE) using the resist pattern 11 as a mask. In this etching process, the exposed part of the insulative substrate 10, which corresponds to the opening OP in the resist pattern 11, is etched away by a depth of, e.g. about 100 nm. Thus, a "+" groove GV, as shown in portion (B) in FIG. 3, is formed in the insulative substrate 10.

Figure 4:
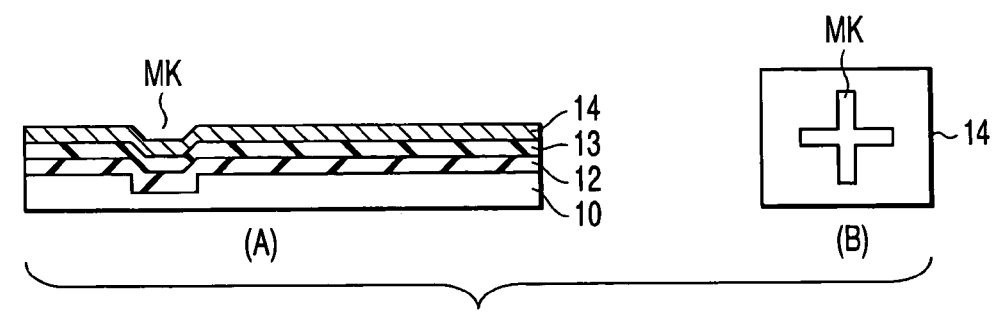
FIG. 4 is a view illustrating a fabrication step of the polysilicon TFT, following the step shown in FIG. 3.

In a step shown in portions (A) and (B) in FIG. 4, the resist pattern 11 is removed, and the insulative substrate 10 is coated with a silicon nitride film ($SiN_x$) 12 having a thickness of, e.g. 50 nm. The silicon nitride film 12 is coated with a silicon oxide film ($SiO_x$) 13 having a thickness of, e.g. 100 nm. The silicon oxide film 13 is coated with an amorphous semiconductor thin film 14 having a thickness of, e.g. 200 nm. The silicon nitride film 12 is formed on the insulative substrate 10 by, e.g. low-temperature plasma CVD (Chemical Vapor Deposition). The silicon oxide film 13 is formed on the silicon nitride film 12 by, e.g. low-temperature plasma CVD. The semiconductor thin film 14 is an amorphous silicon film (a-Si) that is deposited on the silicon oxide film 13 by, e.g. low-temperature CVD. Following the formation of the semiconductor thin film 14, boron (B) is added to the semiconductor thin film 14 by ion shower doping, thereby to control the threshold of the polysilicon TFT that is the active device. As a dopant other than B, $BF_2$ is usable.

The semiconductor thin film 14, silicon oxide film 13 and silicon nitride film 12 are recessed in accordance with the groove GV formed in the insulative substrate 10. Thus, a plurality of alignment marks MK, each having a "+" shape defined by two mutually orthogonal straight lines and indicating a reference position for crystallization, are added to the semiconductor thin film 14. The alignment mark MK is discriminable by a difference in reflectance, relative to its peripheral region.

The thin-film semiconductor substrate that is to be used for crystallizing the semiconductor thin film 14 is thus completed.

In a step illustrated in portions (A) and (B) in FIG. 5, the thin-film semiconductor substrate is placed on a substrate stage that is movable in a horizontal two-dimensional plane, and the thin-film semiconductor substrate is aligned with a phase shifter PS. The phase shifter PS comprises a plurality of reticle patterns RP formed of a light-shield material, a phase shift pattern SP formed of a light transmissive material, and a phase shifter substrate PL of, e.g. transparent glass, which supports the reticle patterns RP and phase shift pattern SP.

The phase shift pattern SP is formed, for example, by selectively etching the phase shifter substrate PL and providing the substrate PL with stepped portions in the thickness direction. Alternatively, the phase shift pattern SP can be obtained by forming a light transmissive film on the phase shifter substrate PL and patterning the light transmissive film.

Each reticle pattern RP has a shape as shown in, e.g. portion (B) of FIG. 5. The reticle patterns RP are disposed so as to be assigned to the alignment marks MK that are added to the semiconductor thin film 14. The phase shifter PS and the thin-film semiconductor substrate are aligned with reference to the alignment marks MK. The thin-film semiconductor substrate is moved along with the substrate stage.

In a step illustrated in portions (A) and (B) in FIG. 6, a laser annealing process is performed by a phase-modulation excimer laser crystallization method in the state in which the alignment marks MK are moved and set at the centers of the associated reticle patterns RP, as shown in portion (B) of FIG. 6. For example, a KrF excimer laser beam with a wavelength of $\lambda=248$ nm is applied to the thin-film semiconductor substrate through the phase shifter PS. The excimer laser beam with an energy density of 500 mJ/cm$^2$ is applied to only the region of the phase shift pattern SP. The phase shift pattern SP functions to diffract the excimer laser beam so as to provide a variation ("high level" and "low level") in intensity of the excimer laser beam on the semiconductor thin film 14 on the thin-film semiconductor substrate side. Specifically, the excimer laser beam is intensity-modulated by the phase shift pattern SP and made incident on the semiconductor thin film 14, thus melting and recrystallizing the amorphous silicon of the semiconductor thin film 14. In the melting/recrystallization, the semiconductor thin film 14 is set to have a temperature gradient corresponding to the excimer laser beam intensity distribution. A plurality of single-crystal silicon grains grow in the lateral direction from the low-temperature region to the high-temperature region. Thus, each single-crystal silicon grain has such a large grain size of, e.g. about 5 to 10 μm, as to be able to contain a semiconductor active device such as a polysilicon TFT. The phase shift pattern SP is formed in stripes in order to align the directions of the single-crystal silicon grains. The shape of the alignment mark MK is defined by two mutually orthogonal straight lines. One of the two straight lines is set to be parallel to the direction of growth of the single-crystal silicon grains, that is, the direction of alignment of stripes of the phase shift pattern SP.

As a result of the laser annealing process, the semiconductor thin film 14 is made into a polysilicon film in which a plurality of large-size single-crystal silicon grains are regularly arranged and surrounded by a countless number of small-size single-crystal silicon grains of polysilicon or amorphous silicon. The alignment marks MK may be left until completion of the last photolithography step since they can be used as reference positioning marks in the lithography steps that are repeated after the laser annealing process. That part of the thin-film semiconductor substrate, which corresponds to the phase shift pattern SP of the phase shifter PS, has a cross-sectional structure as shown in FIG. 7.

In a step shown in FIG. 7, a resist material is coated on the semiconductor thin film 14. Using a photomask MESA, the resist material 15 is selectively exposed. The photomask MESA has a light-shield pattern that is disposed to define active layer regions of a plurality of polysilicon TFTs. The thin-film semiconductor substrate and the photomask MESA are aligned with reference to the alignment marks MK on the thin-film semiconductor substrate.

Figure 8:
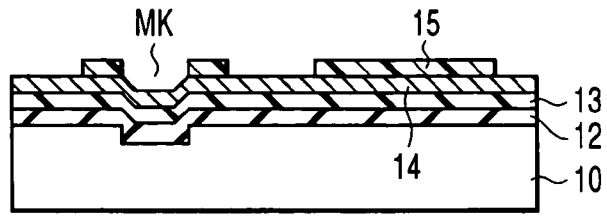
FIG. 8 is a view illustrating a fabrication step of the polysilicon TFT, following the step shown in FIG. 7.

In a step of FIG. 8, a development process is performed to remove the exposed parts of the resist material 15. Consequently, a resist pattern is formed on the semiconductor thin film 14.

Figure 9:
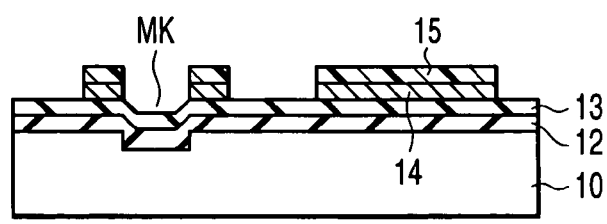
FIG. 9 is a view illustrating a fabrication step of the polysilicon TFT, following the step shown in FIG. 8.

In a step of FIG. 9, the semiconductor thin film 14 is patterned by etching, e.g. dry etching, using the resist pattern as a mask. As an etching gas, CF$_4$ and O$_2$ for instance, is used. By the patterning, the semiconductor thin film 14 is left as active layer regions of a plurality of polysilicon TFTs. These active layer regions are insular regions that are spaced apart from each other and arranged in a matrix. The active layer regions are disposed in a predetermined positional relationship with the alignment marks MK.

Figure 10:
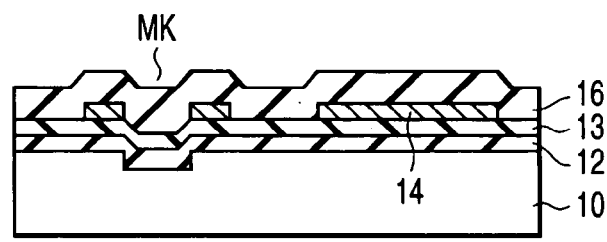
FIG. 10 is a view illustrating a fabrication step of the polysilicon TFT, following the step shown in FIG. 9.

In a step shown in FIG. 10, the resist pattern of the resist material 15 is removed from the semiconductor thin film 14, and a gate insulation film 16 is formed to cover the insulative substrate 10 and semiconductor thin film 14. The gate insulation film 16 is a silicon oxide film that is formed by, e.g. LP-CVD.

Figure 11:
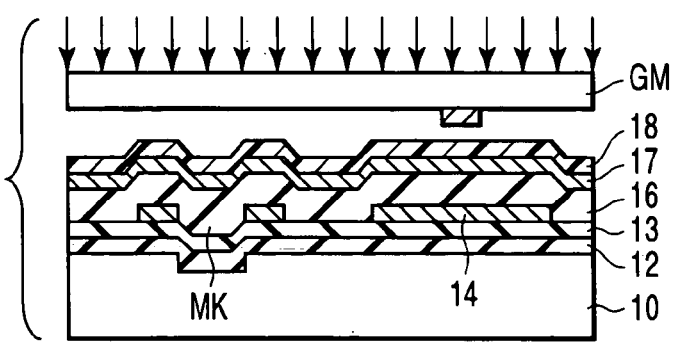
FIG. 11 is a view illustrating a fabrication step of the polysilicon TFT, following the step shown in FIG. 10.

In a step of FIG. 11, an electrode layer 17 is formed on the gate insulation film 16, and a resist material 18 is coated on the electrode layer 17. The electrode layer 17 is an aluminum layer that is formed on the gate insulation film 16 by, e.g. sputtering. The resist material 18 is selectively exposed using a photomask GM. The photomask GM has a light-shield pattern that defines gate regions of the plurality of polysilicon TFTs. Like the photomask MESA, the photomask GM and the thin-film semiconductor substrate are aligned with reference to the alignment marks MK on the semiconductor thin film 14.

Figure 12:
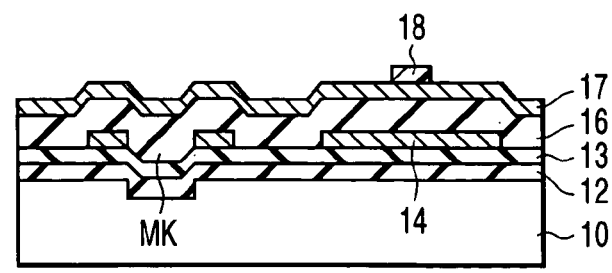
FIG. 12 is a view illustrating a fabrication step of the polysilicon TFT, following the step shown in FIG. 11.

In a subsequent step of FIG. 12, the exposed parts of the resist material 18 are removed, and thus the resist material 18 is developed into a resist pattern that is left on the electrode layer 17.

Figure 13:
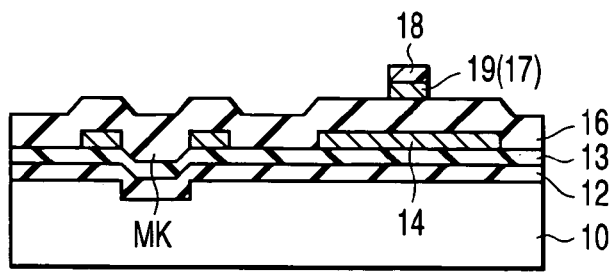
FIG. 13 is a view illustrating a fabrication step of the polysilicon TFT, following the step shown in FIG. 12.

In a step of FIG. 13, the electrode layer 17 is patterned by dry etching, using the resist pattern as a mask. As a result, the electrode layer 17 is left as a gate electrode 19 on the gate insulation film 16. In the dry etching process, BCl$_3$ and CH$_4$, for instance, is used as an etching gas.

Figure 14:
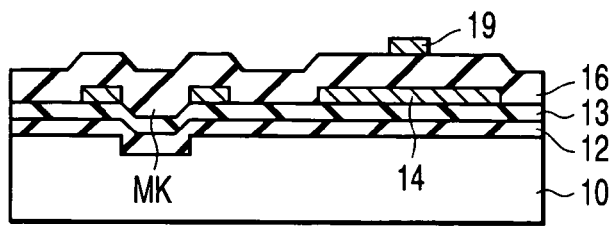
FIG. 14 is a view illustrating a fabrication step of the polysilicon TFT, following the step shown in FIG. 13.

In a step illustrated in FIG. 14, the resist pattern of the resist material 18 is removed from the gate electrode 19.

Figure 15:
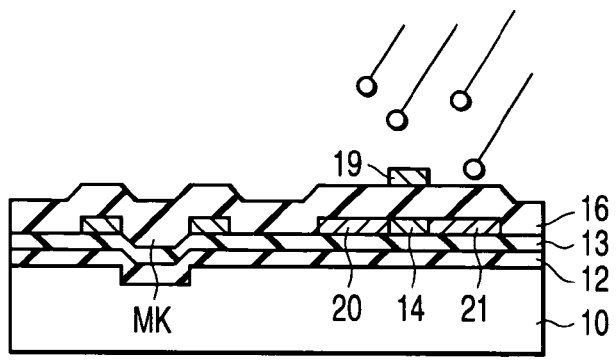
FIG. 15 is a view illustrating a fabrication step of the polysilicon TFT, following the step shown in FIG. 14.

In a step of FIG. 15, impurities are doped in the semiconductor thin film 14 using the gate electrode 19 as a mask. In the case where the polysilicon TFT to be formed is of an n-channel type, phosphorus is ion-implanted in the semiconductor thin film 14. In the case where the polysilicon TFT to be formed is of a p-channel type, boron is ion-implanted in the semiconductor thin film 14. For example a logic circuit such as a CMOS inverter is composed of a combination of an n-channel polysilicon TFT and a p-channel polysilicon TFT. Thus, ion implantation in one of the n-channel polysilicon TFT and p-channel polysilicon TFT is performed in the state in which the semiconductor thin film 14 of the other polysilicon TFT is covered with a mask such as a resist, which prevents undesired ion implantation. After impurity ions are implanted in each of the n-channel polysilicon TFT and p-channel polysilicon TFT, the semiconductor thin film 14 is activated by annealing. The annealing is conducted in a nitrogen atmosphere. Thus, a source region 20 and a drain region 21, which have high impurity concentrations, are formed in the semiconductor thin film on both sides of the gate electrode 19.

Figure 16:
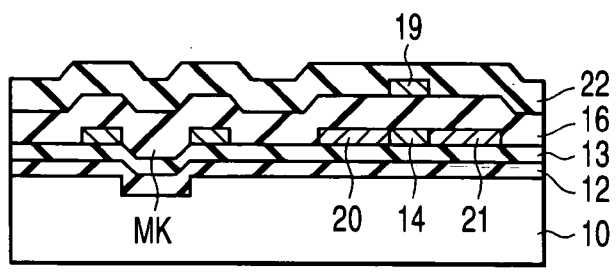
FIG. 16 is a view illustrating a fabrication step of the polysilicon TFT, following the step shown in FIG. 15.

In a step shown in FIG. 16, an interlayer insulation film 22 is formed on the gate electrode 19 and gate insulation film 16. The interlayer insulation film 22 is a silicon oxide film that is deposited on the gate electrode 19 and gate insulation film 16 by, e.g. plasma CVD.

Figure 17:
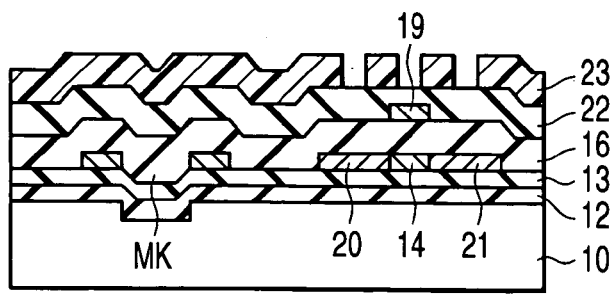
FIG. 17 is a view illustrating a fabrication step of the polysilicon TFT, following the step shown in FIG. 16.

In a step of FIG. 17, a resist material is coated on the interlayer insulation film 22. The resist material is selectively exposed through a photomask, which is disposed with reference to the alignment marks MK added to the semiconductor thin film 14. The exposed parts of the resist material are removed, and the resist material is developed into a resist pattern 23 that is left on the interlayer insulation film 22.

Figure 18:
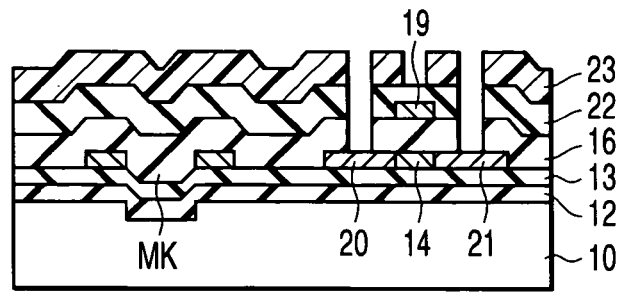
FIG. 18 is a view illustrating a fabrication step of the polysilicon TFT, following the step shown in FIG. 17.

In a step of FIG. 18, the interlayer insulation film 22 and gate insulation film 16 are patterned by dry etching, using the resist pattern 23 as a mask. Thereby, contact holes are formed to partly expose the gate electrode 19, source region 20 and drain region 21. In the dry etching, $CHF_3$, for instance, is used as an etching gas.

Figure 19:
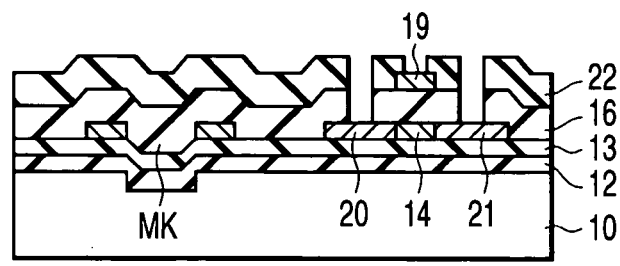
FIG. 19 is a view illustrating a fabrication step of the polysilicon TFT, following the step shown in FIG. 18.

In a step illustrated in FIG. 19, the resist pattern 23 is removed from the interlayer insulation film 22.

Figure 20:
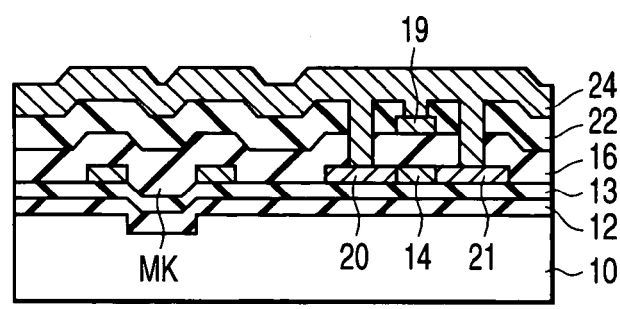
FIG. 20 is a view illustrating a fabrication step of the polysilicon TFT, following the step shown in FIG. 19.

In a step of FIG. 20, an electrode layer 24 is formed on the interlayer insulation film 22 so as to contact the gate electrode 19, source region 20 and drain region 21. The electrode layer 24 is an aluminum layer that is deposited on the interlayer insulation film 22 by, e.g. sputtering.

Figure 21:
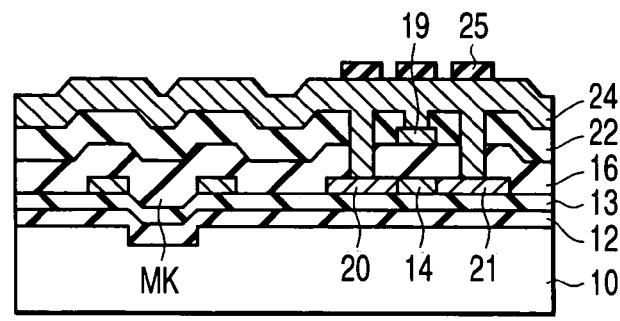
FIG. 21 is a view illustrating a fabrication step of the polysilicon TFT, following the step shown in FIG. 20.

In a step of FIG. 21, a resist material is coated on the electrode layer 24. The resist material is selectively exposed using a photomask that is aligned with reference to the alignment marks on the thin-film semiconductor substrate. The exposed parts of the resist material are removed, and the resist material is developed into a resist pattern 25 that is left on the electrode layer 24.

Figure 22:
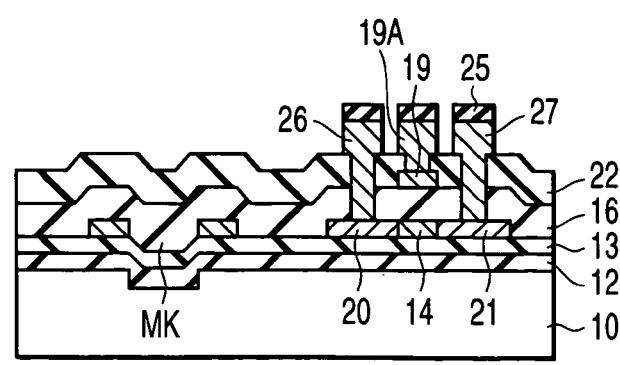
FIG. 22 is a view illustrating a fabrication step of the polysilicon TFT, following the step shown in FIG. 21.

In a step of FIG. 22, using the resist pattern 25 as a mask, the electrode layer 23 is patterned by dry etching. The patterned electrode layer 23 is left on the interlayer insulation film 21 as an upper gate electrode 19A, a source electrode 26 and a drain electrode 27. In the dry etching process, $BCl_3$ and $CH_4$, for instance, is used as an etching gas.

Figure 23:
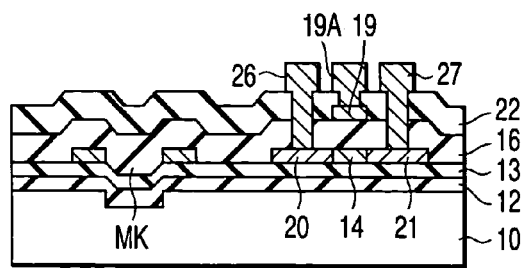
FIG. 23 is a view illustrating a fabrication step of the polysilicon TFT, following the step shown in FIG. 22.

In a step illustrated in FIG. 23, the resist pattern 25 is removed from the upper gate electrode 18A, source electrode 26 and drain electrode 27. The polysilicon TFT is thus completed.

Figure 24:
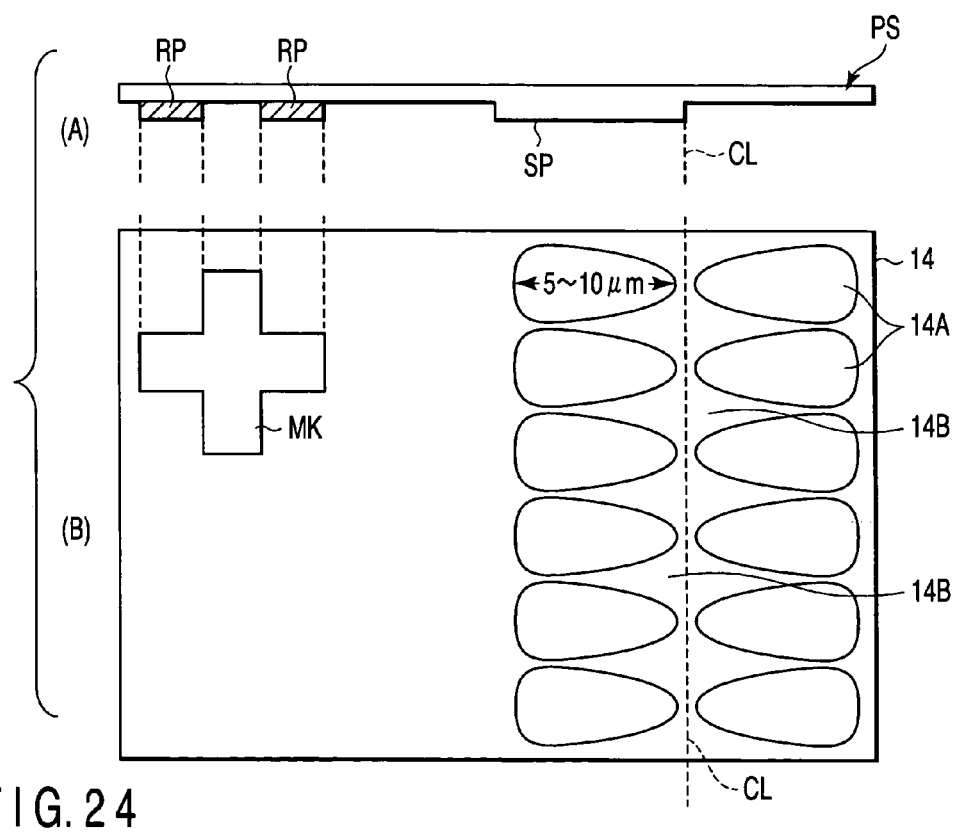
FIG. 24 is a view showing the positional relationship between a phase shift pattern of a phase shifter that is used in the step of FIG. 6, and single-crystal silicon grains formed using the phase shift pattern.

A description is given of the positional relation-ship between the single-crystal silicon grains obtained in the step illustrated in portions (A) and (B) of FIG. 6 and the polysilicon TFT obtained in the step of FIG. 23. In the laser annealing process, an excimer laser beam is applied through the phase shifter PS, which has a cross section as shown in, e.g. portion (A) of FIG. 24. Then, large-size single-crystal grains 14A are disposed in symmetry with respect to a boundary CL, which extends along a stepped portion defined in a phase shift pattern SP of the phase shifter PS, on a plane of the semiconductor thin film 14 shown in portion (B) of FIG. 24. In addition, small-size single-crystal silicon grains 14b and amorphous silicon are disposed to surround the large-size single-crystal silicon grains 14A.

Figure 25:
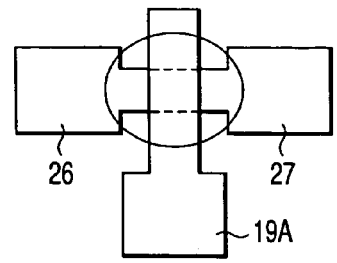
FIG. 25 shows a plan-view structure of the polysilicon TFT that is completed in the step of FIG. 23.
Figure 26:
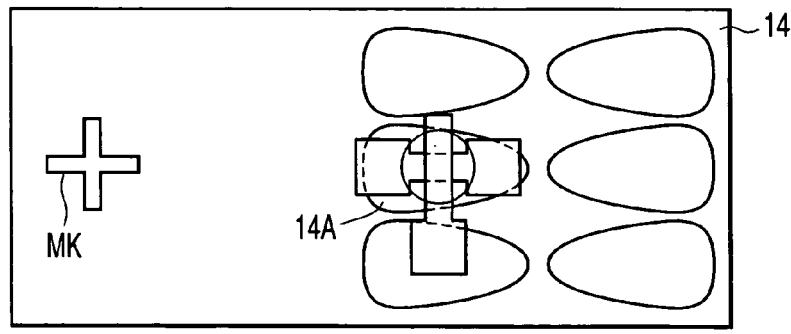
FIG. 26 shows an example of disposition in which the entire active layer of the polysilicon TFT shown in FIG. 25 is positioned within a large-size single-crystal silicon grain.
Figure 27:
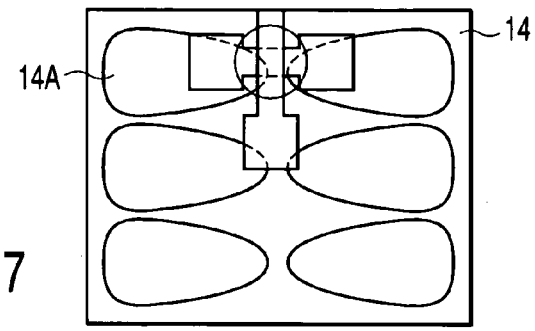
FIG. 27 shows a first example of disposition in which the polysilicon TFT shown in FIG. 25 is displaced from the large-size single-crystal silicon grain.
Figure 28:
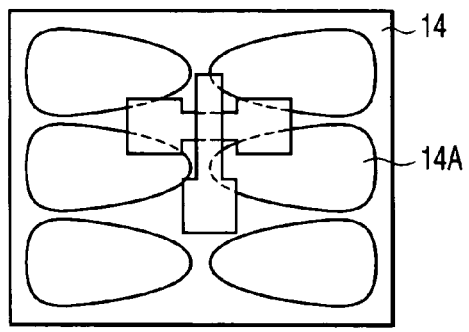
FIG. 28 shows a second example of disposition in which the polysilicon TFT shown in FIG. 25 is displaced from the large-size single-crystal silicon grain.
Figure 29:
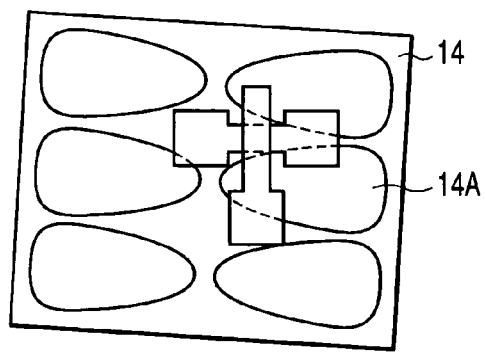
FIG. 29 shows a third example of disposition in which the polysilicon TFT shown in FIG. 25 is displaced from the large-size single-crystal silicon grain.

FIG. 25 shows a plan-view structure of the polysilicon TFT that is completed in the step of FIG. 23. The polysilicon TFT has an active layer in a region encircled in FIG. 25. Hence, the electrical characteristics of the polysilicon TFT depend greatly on the crystallinity of the insular region of the semiconductor thin film 14, which becomes the active layer of the polysilicon TFT. In a case shown in FIG. 26 where the entire active layer of the polysilicon TFT is disposed within the large-size single-crystal silicon grain 14A, the polysilicon TFT is provided with excellent electrical characteristics. FIG. 27, FIG. 28 and FIG. 29 show examples in which the polysilicon TFT is disposed with a displacement from the large-size single-crystal grain 14A. In this case, the insular region is formed to include non-uniform crystalline silicon that surrounds the large-size single-crystal silicon grain. Consequently, the polysilicon TFT cannot be provided with good electrical characteristics.

Figure 30:
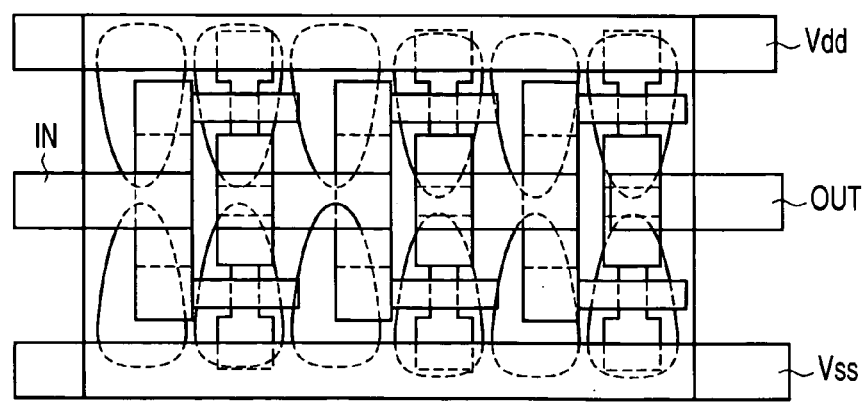
FIG. 30 shows an example of an inverter circuit that comprises a plurality of polysilicon TFTs.

FIG. 30 shows an example of an inverter circuit that comprises a plurality of polysilicon TFTs. The polysilicon TFTs are interconnected in the state in which they are exactly disposed within the associated large-size single-crystal silicon grains that are regularly arranged. Therefore, the electrical characteristics of the inverter circuit are improved in accordance with the excellent electrical characteristics that are imparted to the polysilicon TFTs.

FIGS. 26 to 30 are schematic views for describing the dispositions of the polysilicon TFTs, relative to the single-crystal silicon grains 14A in the semiconductor thin film 14. The semiconductor thin film 14 is divided into the aforementioned insular regions in the step illustrated in FIG. 9. Thus, in reality, when the fabrication of the polysilicon TFTs is completed, the large-size silicon grains 14A do not exit in such shapes as shown in the Figures.

In the thin-film semiconductor device according to this embodiment, a plurality of alignment marks MK are formed integral with the semiconductor thin film 14 for crystallizing the semiconductor thin film 14. These alignment marks MK can be used as reference positions for determining the mask position in the step of crystallizing the semiconductor thin film 14, or the mask position in the step of forming semiconductor active devices such as polysilicon TFTs in the semiconductor thin film 14. Hence, semiconductor active devices can be formed with high reliability within the regions of the large-size single-crystal semiconductor grains 14A that are obtained by crystallizing the semiconductor thin film 14. In addition, since the direction of lateral growth can be determined at the stage of design of the phase shifter PS, it is possible to determine the surface orientation of silicon that corresponds to the direction of current of the polysilicon TFT.

In the case where the single-crystal silicon grain is grown in the lateral direction by the above-described phase-modulation excimer laser crystallization method, the direction of growth, which corresponds to a low-index surface of silicon, is a (110) or (001) direction. Hence, preferential orientation can be exhibited by forming alignment marks MK that have such shapes as to indicate the direction of growth. As is known, the mobility of crystal silicon varies depending on the orientation of current direction. Using the above-described structure, the semiconductor active device can be formed in the determined orientation.

In the above-described embodiment, the alignment marks MK that are provided over the insulative substrate 10 shown in FIG. 3 may be made by laser irradiation. The alignment marks MK may be located not only on the insulative substrate 10, but also on the semiconductor thin film or on the insulation film that is formed as the underlayer of the semiconductor thin film. Possible patterns of the alignment mark MK include a recess pattern of, e.g. a groove or an opening, and a projection pattern of, e.g. a crystallized part or a formed film. In the above-described embodiment, crystallized regions and functional devices are formed with alignment to the alignment marks MK provided over the substrate.

A thin-film semiconductor device according to a second embodiment of the present invention will now be described with reference to the accompanying drawings. This thin-film semiconductor device is a polysilicon TFT that is manufactured similarly with the first embodiment, except that the thin-film semiconductor substrate is formed by steps illustrated in FIGS. 31 to 36. In FIGS. 31 to 36, the parts common to those in the first embodiment are denoted by like reference numerals, and a description thereof is omitted or simplified.

FIG. 31 to FIG. 36 illustrate successive fabrication steps for manufacturing the polysilicon TFT. Portions (A) in FIGS. 31 to 36 are partial cross-sectional views, and portions (B) in FIGS. 31 to 36 are partial plan views.

Figure 31:
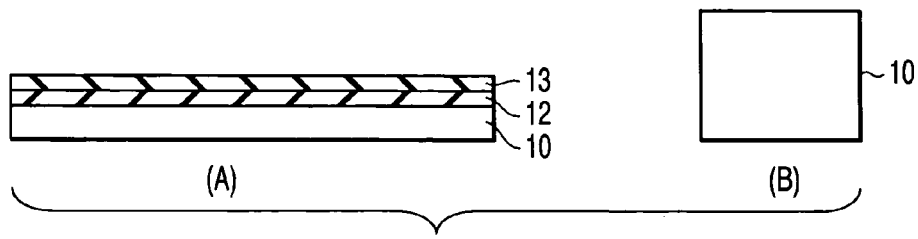
FIG. 31 is a view illustrating a fabrication step of a polysilicon TFT that is a thin-film semiconductor device according to a second embodiment of the present invention.

In a step shown in portions (A) and (B) of FIG. 31, an insulative substrate 10 of, e.g. quartz or no-alkali glass is prepared. The insulative substrate 10 is subjected to pretreatment of, e.g. scrubber washing or immersion in hydrofluoric acid. In this example, the insulative substrate 10 is formed of Corning #1737 glass. The insulative substrate 10 is coated with a silicon nitride film ($SiN_x$) 12 having a thickness of, e.g. 50 nm. The silicon nitride film 12 is coated with a silicon oxide film ($SiO_x$) 13 having a thickness of, e.g. 100 nm. The silicon nitride film 12 is formed on the insulative substrate 10 by, e.g. low-temperature plasma CVD. The silicon oxide film 13 is formed on the silicon nitride film 12 by, e.g. low-temperature plasma CVD.

Figure 32:
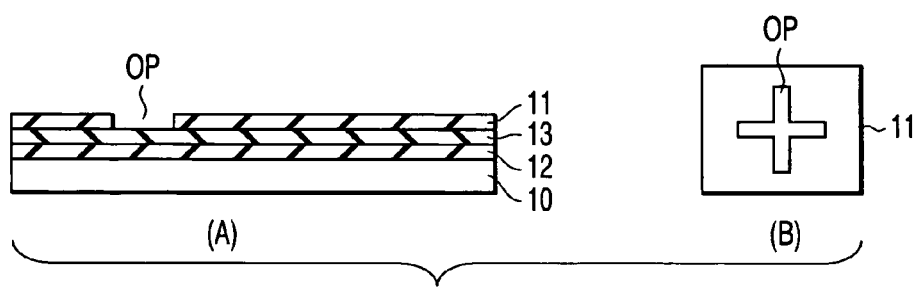
FIG. 32 is a view illustrating a fabrication step of the polysilicon TFT, following the step shown in FIG. 31.

In a step shown in portions (A) and (B) in FIG. 32, a resist material is coated on the silicon oxide film 13. The resist material is selectively exposed using a photomask. The exposed part is removed and thus the resist material is developed into a resist pattern 11, which is left on the silicon oxide film 13. The resist pattern 11 has a plurality of openings OP each having, e.g. a "+" shape as shown in portion (B) of FIG. 32. The insulative substrate 10 is exposed at the openings OP. In portions (A) and (B) in FIG. 32, only one of the openings OP is shown.

Figure 33:
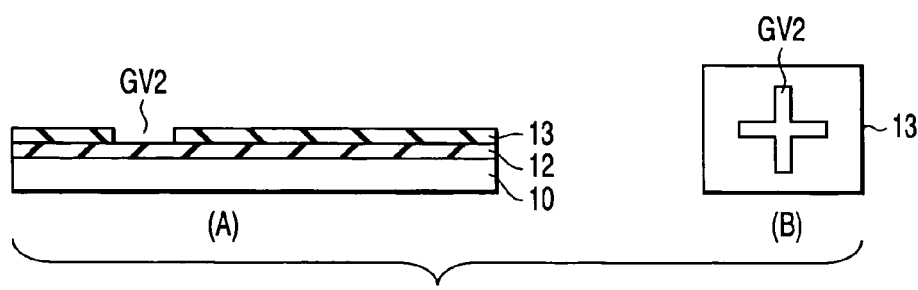
FIG. 33 is a view illustrating a fabrication step of the polysilicon TFT, following the step shown in FIG. 32.

In a step illustrated in portions (A) and (B) in FIG. 33, the silicon oxide film 13 and silicon nitride film 12 are subjected to reactive ion etching (RIE) using the resist pattern 11 as a mask. In this etching process, the exposed parts of the silicon oxide film 13 and silicon nitride film 12, which correspond to the opening OP in the resist pattern 11, are etched away. Thus, a "+" groove GV2, as shown in portion (B) in FIG. 33, is formed.

Figure 34:
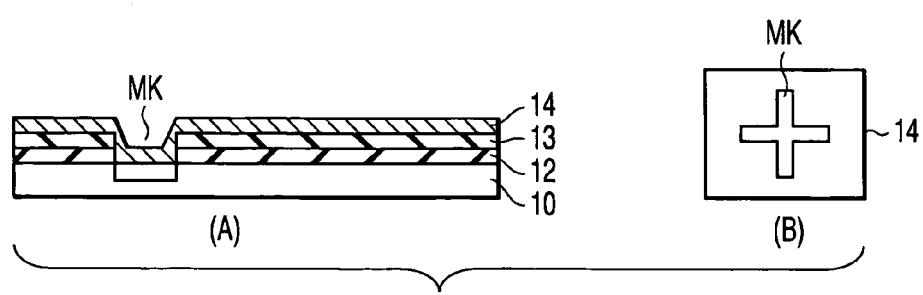
FIG. 34 is a view illustrating a fabrication step of the polysilicon TFT, following the step shown in FIG. 33.

In a step shown in portions (A) and (B) in FIG. 34, the resist pattern 11 is removed, and an amorphous semiconductor thin film 14 having a thickness of, e.g. 200 nm is formed on the silicon oxide film 13 so as to cover the groove GV2. The semiconductor thin film 14 is an amorphous silicon film (a-Si) that is deposited on the silicon oxide film 13 by, e.g. low-temperature CVD (Chemical Vapor Deposition). Following the formation of the semiconductor thin film 14, boron (B) is added to the semiconductor thin film 14 by ion shower doping, thereby to control the threshold of the polysilicon TFT that is the active device. As a dopant other than B, $BF_2$ is usable.

The semiconductor thin film 14 is recessed in accordance with the groove GV2 formed in the silicon oxide film 13 and silicon nitride film 12. Thus, a plurality of alignment marks MK, each having a "+" shape and indicating a reference position for crystallization, are added to the semiconductor thin film 14. The alignment mark MK is discriminable by a difference in reflectance, relative to its peripheral region.

The thin-film semiconductor substrate that is to be used for crystallizing the semiconductor thin film 14 is thus completed.

In a step illustrated in portions (A) and (B) in FIG. 35, the thin-film semiconductor substrate is placed on a substrate stage that is movable in a horizontal two-dimensional plane, and the thin-film semiconductor substrate is aligned with a phase shifter PS. The phase shifter PS comprises a plurality of reticle patterns RP, a phase shift pattern SP, and a phase shifter substrate PL, which are the same as those in the first embodiment. The phase shifter PS and the thin-film semiconductor substrate are aligned with reference to the alignment marks MK. The thin-film semiconductor substrate is moved along with the substrate stage.

In a step illustrated in portions (A) and (B) in FIG. 36, a laser annealing process is performed by a phase-modulation excimer laser crystallization method in the state in which the alignment marks MK are moved and set at the centers of the associated reticle patterns RP, as shown in portion (B) of FIG. 36. For example, a KrF excimer laser beam with a wavelength of $\lambda=248$ nm is applied to the thin-film semiconductor substrate through the phase shifter PS. The excimer laser beam with an energy density of 500 mJ/cm$^2$ is applied to only the region of the phase shift pattern SP. The phase shift pattern SP functions to diffract the excimer laser beam so as to provide a variation ("high level" and "low level") in intensity of the excimer laser beam on the semiconductor thin film 14 on the thin-film semiconductor substrate side. Specifically, the excimer laser beam is intensity-modulated by the phase shift pattern SP and made incident on the semiconductor thin film 14, thus melting and recrystallizing the amorphous silicon of the semiconductor thin film 14.

As a result of the laser annealing process, the semiconductor thin film 14 is made into a polysilicon film in which a plurality of large-size single-crystal silicon grains are regularly arranged and surrounded by a countless number of small-size single-crystal silicon grains of polysilicon or amorphous silicon. The alignment marks MK may be left until completion of the last photolithography step since they can be used as reference positioning marks in the lithography steps that are repeated after the laser annealing process.

In this embodiment, a plurality of recesses are formed as the alignment marks MK that are made integral to the semiconductor thin film 14. Therefore, like the first embodiment, polysilicon TFTs can be formed with high reliability within the regions of the large-size single-crystal semiconductor grains that are obtained by crystallizing the semiconductor thin film 14.

A thin-film semiconductor device according to a third embodiment of the present invention will now be described with reference to the accompanying drawings. This thin-film semiconductor device is a polysilicon TFT that is manufactured similarly with the first embodiment, except that the thin-film semiconductor substrate is formed by steps illustrated in FIGS. 37 to 41. In FIGS. 37 to 41, the parts common to those in the first embodiment are denoted by like reference numerals, and a description thereof is omitted or simplified.

FIG. 37 to FIG. 41 illustrate successive fabrication steps for manufacturing the polysilicon TFT. Portions (A) in FIGS. 37 to 41 are partial cross-sectional views, and portions (B) in FIGS. 37 to 41 are partial plan views.

In a step shown in portions (A) and (B) of FIG. 37, an insulative substrate 10 of, e.g. quartz or no-alkali glass is prepared. The insulative substrate 10 is subjected to pre-treatment of, e.g. scrubber washing or immersion in hydrofluoric acid. In this example, the insulative substrate 10 is formed of Corning #1737 glass. The insulative substrate 10 is coated with a silicon nitride film ($SiN_x$) 12 having a thickness of, e.g. 50 nm. The silicon nitride film 12 is coated with a silicon oxide film ($SiO_x$) 13 having a thickness of, e.g. 100 nm. The silicon oxide film 13 is coated with an amorphous semiconductor thin film 14 having a thickness of, e.g. 200 nm. The silicon nitride film 12 is formed on the insulative substrate 10 by, e.g. low-temperature plasma CVD. The silicon oxide film 13 is formed on the silicon nitride film 12 by, e.g. low-temperature plasma CVD. The semiconductor thin film 14 is an amorphous silicon film (a-Si) that is deposited on the silicon oxide film 13 by, e.g. low-temperature CVD (Chemical Vapor Deposition). Following the formation of the semiconductor thin film 14, boron (B) is added to the semiconductor thin film 14 by ion shower doping, thereby to control the threshold of the polysilicon TFT that is the active device. As a dopant other than B, $BF_2$ is usable.

In a step shown in portions (A) and (B) in FIG. 38, a resist material is coated on the semiconductor thin film 14. The resist material is selectively exposed using a photomask. The exposed part is removed and thus the resist material is developed into a resist pattern 11, which is left on the insulative substrate 10. The resist pattern 11 has a plurality of openings OP each having, e.g. a "+" shape as shown in portion (B) of FIG. 38. The insulative substrate 10 is exposed at the openings OP. In portions (A) and (B) in FIG. 38, only one of the openings OP is shown.

Figure 39:
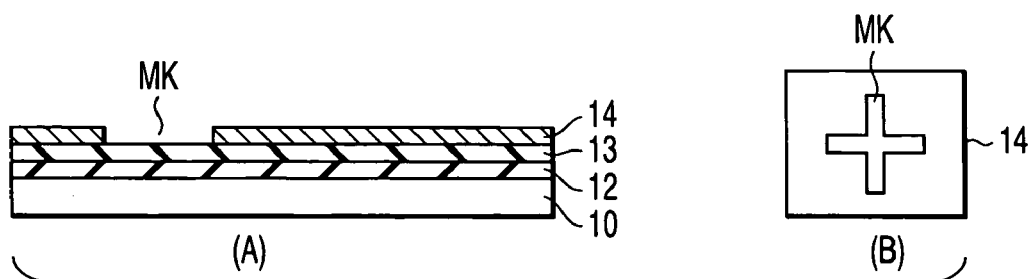
FIG. 39 is a view illustrating a fabrication step of the polysilicon TFT, following the step shown in FIG. 38.

In a step illustrated in portions (A) and (B) in FIG. 39, the semiconductor thin film 14 is subjected to reactive ion etching (RIE) using the resist pattern 11 as a mask. In this etching process, that part of the semiconductor thin film 14, which corresponds to the opening OP in the resist pattern 11, is etched away. Thus, a "+" opening, as shown in portion. (B) in FIG. 39, is formed. A plurality of openings are thus formed in the semiconductor thin film 14. The openings function as alignment marks MK indicating reference positions for crystallization. The alignment mark MK is discriminable by a difference in reflectance, relative to its peripheral region.

The thin-film semiconductor substrate that is to be used for crystallizing the semiconductor thin film 14 is thus completed.

Figure 40:
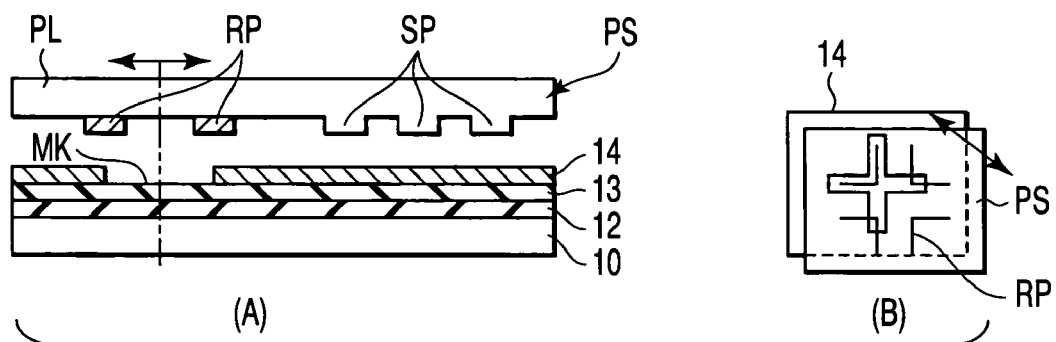
FIG. 40 is a view illustrating a fabrication step of the polysilicon TFT, following the step shown in FIG. 39.

In a step illustrated in portions (A) and (B) in FIG. 40, the thin-film semiconductor substrate is placed on a substrate stage that is movable in a horizontal two-dimensional plane, and the thin-film semiconductor substrate is aligned with a phase shifter PS. The phase shifter PS comprises a plurality of reticle patterns RP, a phase shift pattern SP, and a phase shifter substrate PL, which are the same as those in the first embodiment. The phase shifter PS and the thin-film semiconductor substrate are aligned with reference to the alignment marks MK. The thin-film semiconductor substrate is moved along with the substrate stage.

Figure 41:
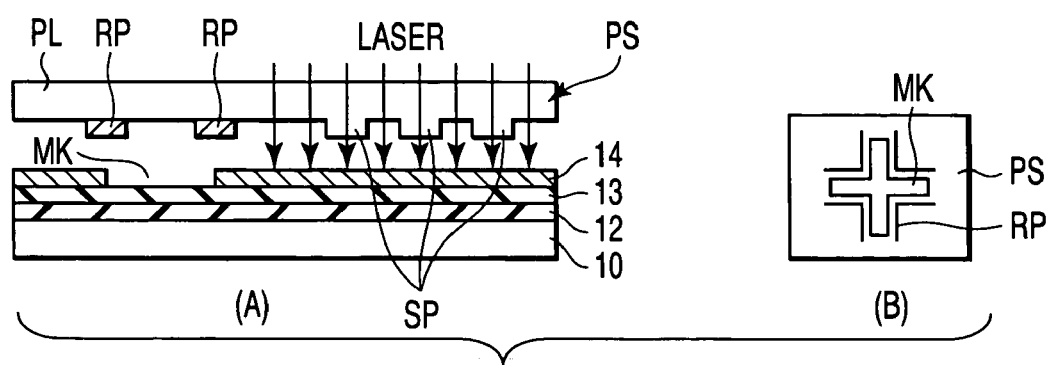
FIG. 41 is a view illustrating a fabrication step of the polysilicon TFT, following the step shown in FIG. 40.

In a step illustrated in portions (A) and (B) in FIG. 41, a laser annealing process is performed by a phase-modulation excimer laser crystallization method in the state in which the alignment marks MK are moved and set at the centers of the associated reticle patterns RP, as shown in portion (B) of FIG. 41. For example, a KrF excimer laser beam with a wavelength of $\lambda=248$ nm is applied to the thin-film semiconductor substrate through the phase shifter PS. The excimer laser beam with an energy density of 500 mJ/cm$^2$ is applied to only the region of the phase shift pattern SP. The phase shift pattern SP functions to diffract the excimer laser beam so as to provide a variation ("high level" and "low level") in intensity of the excimer laser beam on the semiconductor thin film 14 on the thin-film semiconductor substrate side. Specifically, the excimer laser beam is intensity-modulated by the phase shift pattern SP and made incident on the semiconductor thin film 14, thus melting and recrystallizing the amorphous silicon of the semiconductor thin film 14.

As a result of the laser annealing process, the semiconductor thin film 14 is made into a polysilicon film in which a plurality of large-size single-crystal silicon grains are regularly arranged and surrounded by a countless number of small-size single-crystal silicon grains of polysilicon or amorphous silicon. The alignment marks MK may be left until completion of the last photolithography step since they can be used as reference positioning marks in the lithography steps that are repeated after the laser annealing process.

In this embodiment, a plurality of openings are formed as the alignment marks MK that are made integral to the semiconductor thin film 14. Therefore, like the first embodiment, polysilicon TFTs can be formed with high reliability within the regions of the large-size single-crystal semiconductor grains that are obtained by crystallizing the semiconductor thin film 14.

A thin-film semiconductor device according to a fourth embodiment of the present invention will now be described with reference to the accompanying drawings. This thin-film semiconductor device is a polysilicon TFT that is manufactured similarly with the first embodiment, except that the thin-film semiconductor substrate is formed by steps illustrated in FIGS. 42 to 45. In FIGS. 42 to 45, the parts common to those in the first embodiment are denoted by like reference numerals, and a description thereof is omitted or simplified.

Figure 42:
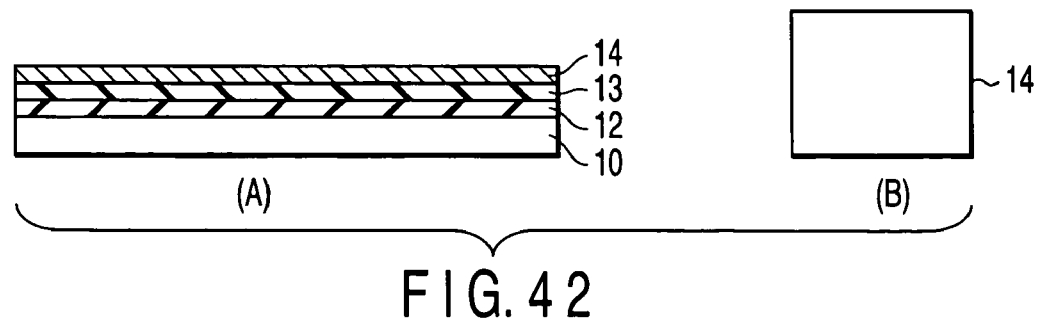
FIG. 42 is a view illustrating a fabrication step of a polysilicon TFT that is a thin-film semiconductor device according to a fourth embodiment of the present invention.

FIG. 42 to 45 illustrate successive fabrication steps for manufacturing the polysilicon TFT. Portions (A) in FIGS. 42 and 43 are partial cross-sectional views, and portions (B) in FIGS. 42 and 43 are partial plan views.

In a step shown in portions (A) and (B) of FIG. 42, an insulative substrate 10 of, e.g. quartz or no-alkali glass is prepared. The insulative substrate 10 is subjected to pre-treatment of, e.g. scrubber washing or immersion in hydrofluoric acid. In this example, the insulative substrate 10 is formed of Corning #1737 glass. The insulative substrate 10 is coated with a silicon nitride film (SiN$_x$) 12 having a thickness of, e.g. 50 nm. The silicon nitride film 12 is coated with a silicon oxide film (SiO$_x$) 13 having a thickness of, e.g. 100 nm. The silicon oxide film 13 is coated with an amorphous semiconductor thin film 14 having a thickness of, e.g. 200 nm. The silicon nitride film 12 is formed on the insulative substrate 10 by, e.g. low-temperature plasma CVD. The silicon oxide film 13 is formed on the silicon nitride film 12 by, e.g. low-temperature plasma CVD. The semiconductor thin film 14 is an amorphous silicon film (a-Si) that is deposited on the silicon oxide film 13 by, e.g. low-temperature CVD (Chemical Vapor Deposition). Following the formation of the semiconductor thin film 14, boron (B) is added to the semiconductor thin film 14 by ion shower doping, thereby to control the threshold of the polysilicon TFT that is the active device. As a dopant other than B, BF$_2$ is usable.

The thin-film semiconductor substrate that is to be used for crystallizing the semiconductor thin film 14 is thus completed.

In a step illustrated in portions (A) and (B) in FIG. 43, the thin-film semiconductor substrate is placed on a substrate stage that is movable in a horizontal two-dimensional plane, and the thin-film semiconductor substrate is roughly positioned so as to face a phase shifter PS. The phase shifter PS comprises a plurality of marking patterns MP formed of a light shield material, a phase shift pattern SP formed of a light transmissive material, and a phase shifter substrate PL formed of, e.g. transparent glass, which supports the marking patterns MP and phase shift pattern SP. Each marking pattern MP has a "+" opening as shown in portion (B) of FIG. 43. The phase shift pattern SP is formed similarly with the first embodiment.

In a step illustrated in FIG. 44, a laser trimming process is performed in the state in which the thin-film semiconductor substrate is opposed to the phase shifter, as mentioned above. In the laser trimming process, a laser beam is applied only to the region of the marking pattern MP with an energy density for trimming. Through the opening of the marking pattern MP, the laser beam is made incident on the semiconductor thin film 14. Thereby, the semiconductor thin film 14 is partly trimmed on the silicon oxide film 13 in accordance with the shape of the opening of the marking pattern MP. Thus, the "+" openings are formed in the semiconductor thin film 14 and function as alignment marks MK indicating reference positions for crystallization. The alignment mark MK is discriminable by a difference in reflectance, relative to its peripheral region. In portions (A) and (B) in FIG. 43, only one of the alignment marks MK is shown.

In a step illustrated in FIG. 45, a laser annealing process is performed by a phase-modulation excimer laser crystallization method. In the laser annealing process, the position where the thin-film semiconductor substrate is subjected to the trimming process is used as a reference position, and a KrF excimer laser beam, for example, with a wavelength of λ=248 nm is applied to the thin-film semiconductor substrate through the phase shifter PS. The excimer laser beam with an energy density of 500 mJ/cm$^2$ is applied to only the region of the phase shift pattern SP. The phase shift pattern SP functions to diffract the excimer laser beam so as to provide a variation ("high level" and "low level") in intensity of the excimer laser beam on the semiconductor thin film 14 on the thin-film semiconductor substrate side. Specifically, the excimer laser beam is intensity-modulated by the phase shift pattern SP and made incident on the semiconductor thin film 14, thus melting and recrystallizing the amorphous silicon of the semiconductor thin film 14.

As a result of the laser annealing process, the semiconductor thin film 14 is made into a polysilicon film in which a plurality of large-size single-crystal silicon grains are regularly arranged and surrounded by a countless number of small-size single-crystal silicon grains of polysilicon or amorphous silicon.

The alignment marks MK may be left until completion of the last photolithography step since they can be used as reference positioning marks in the lithography steps that are repeated after the laser annealing process.

In this embodiment, a plurality of openings are formed by laser trimming as the alignment marks MK that are made integral to the semiconductor thin film 14. The laser trimming process is performed in the state in which the thin-film semiconductor substrate is roughly positioned so as to face the phase shifter PS. The subsequent laser annealing process is performed, while keeping the position of the thin-film semiconductor substrate that is disposed for the laser trimming process. Thus, precise alignment between the thin-film semiconductor substrate and the phase shifter PS is not required to keep a predetermined positional relationship between the alignment marks MK and the large-size single-crystal silicon grains, which are to be formed in the semiconductor thin film 14 in the laser annealing process. Moreover, the alignment marks MK are used as reference marks for alignment in the photolithography that is repeated after the laser annealing process. Therefore, like the first embodiment, polysilicon TFTs can be formed with high reliability within the regions of the large-size single-crystal semiconductor grains.

A thin-film semiconductor device according to a fifth embodiment of the present invention will now be described with reference to the accompanying drawings. This thin-film semiconductor device is a polysilicon TFT that is manufactured similarly with the first embodiment, except that the thin-film semiconductor substrate is formed by steps illustrated in FIGS. 46 to 48. In FIGS. 46 to 48, the parts common to those in the first embodiment are denoted by like reference numerals, and a description thereof is omitted or simplified.

FIG. 46 to 48 are partial cross-sectional views that illustrate successive fabrication steps for manufacturing the polysilicon TFT.

In a step shown in FIG. 46, an insulative substrate 10 of e.g. quartz or no-alkali glass is prepared. The insulative substrate 10 is subjected to pre-treatment of, e.g. scrubber washing or immersion in hydrofluoric acid. In this example, the insulative substrate 10 is formed of Corning #1737 glass. The insulative substrate 10 is coated with a silicon nitride film (SiN$_x$) 12 having a thickness of, e.g. 50 nm. The silicon nitride film 12 is coated with a silicon oxide film (SiO$_x$) 13 having a thickness of, e.g. 100 nm. The silicon oxide film 13 is coated with an amorphous semiconductor thin film 14 having a thickness of, e.g. 200 nm. The silicon nitride film 12 is formed on the insulative substrate 10 by, e.g. low-temperature plasma CVD. The silicon oxide film 13 is formed on the silicon nitride film 12 by, e.g. low-temperature plasma CVD. The semiconductor thin film 14 is an amorphous silicon film (a-Si) that is deposited on the silicon oxide film 13 by, e.g. low-temperature CVD (Chemical Vapor Deposition). Following the formation of the semiconductor thin film 14, boron (B) is added to the semiconductor thin film 14 by ion shower doping, thereby to control the threshold of the polysilicon TFT that is the active device. As a dopant other than B, BF$_2$ is usable.

The thin-film semiconductor substrate that is to be used for crystallizing the semiconductor thin film 14 is thus completed.

In a step illustrated in FIG. 47, the thin-film semiconductor substrate is placed on a substrate stage that is movable in a horizontal two-dimensional plane, and the thin-film semiconductor substrate is roughly positioned so as to face a phase shifter PS. The phase shifter PS comprises a plurality of marking patterns MP formed of a light shield material, a phase shift pattern SP formed of a light transmissive material, and a phase shifter substrate PL formed of, e.g. transparent glass, which supports the marking patterns MP and phase shift pattern SP. Each marking pattern MP has a slit opening. The phase shift pattern SP is formed similarly with the first embodiment.

In a step illustrated in FIG. 48, a laser annealing process is performed by a phase-modulation excimer laser crystallization method. In the laser annealing process, the thin-film semiconductor substrate is kept in the position where it faces the phase shifter, and a KrF excimer laser beam, for example, with a wavelength of λ=248 nm is applied to the thin-film semiconductor substrate through the phase shifter PS. The excimer laser beam with an energy density of 500 mJ/cm$^2$ is applied to the entire phase shifter PS. The excimer laser beam, on the one hand, is made incident on the semiconductor thin film 14 through the opening of the marking pattern MP, and on the other hand, is modulated by the phase shift pattern SP and made incident on the semiconductor thin film 14 thus melting and recrystallizing the amorphous silicon of the semiconductor thin film 14.

As a result of the laser annealing process, the semiconductor thin film 14 is made into a polysilicon film in which a plurality of large-size single-crystal silicon grains are regularly arranged and surrounded by a countless number of small-size single-crystal silicon grains of polysilicon or amorphous silicon in the region corresponding to the phase shift pattern SP. In the region corresponding to the marking pattern MP, the alignment marks MK having a planar structure, as shown in FIG. 48 in enlarged scale, are formed in the semiconductor thin film 14. Each alignment mark MK is formed of a polysilicon film that extends linearly and is surrounded by amorphous silicon. When the semiconductor thin film 14 is illuminated, the polysilicon film of the alignment mark MK looks yellow and the surrounding amorphous silicon looks red. Thus, the alignment mark MK is discriminable by a difference in color. The alignment marks MK may be left until completion of the last photolithography step since they can be used as reference positioning marks in the lithography steps that are repeated after the laser annealing process. When the alignment between the thin-film semiconductor substrate and the photomask is performed in the photolithography, reticle patterns RP are provided on the photomask as shown in FIG. 49. The positions of the thin-film semiconductor substrate and the photomask are adjusted such that the alignment marks MK are set at the centers of the associated reticle patterns RP.

In this embodiment, marking patterns MP are formed on the phase shifter PS along with the phase shift pattern SP. The laser annealing process is performed using the phase shifter PS. Thus, the alignment marks MK can be formed by the very simple method. If the alignment marks MK are used as reference marks for alignment in the photolithography that is repeated after the laser annealing process, polysilicon TFTs can be formed with high reliability within the regions of the large-size single-crystal semiconductor grains, like the first embodiment. The alignment marks MK are not formed in a step independent from the laser annealing process. This makes it unnecessary to align the thin-film semiconductor substrate and the phase shifter PS, which is required in performing the laser annealing process in the first embodiment. Therefore, the number of fabrication steps and the manufacturing time can be decreased, and the manufacturing cost can be reduced.

A laser crystallization apparatus according to a sixth embodiment of the present invention will now be described with reference to the accompanying drawings. The laser crystallization apparatus is used to perform a laser annealing process on the thin-film semiconductor substrates that are obtained during the manufacture of the thin-film semiconductor devices according to the first, second and third embodiments.

FIG. 50 shows a schematic structure of a transfer robot for transferring a thin-film semiconductor substrate into and out of the laser crystallization apparatus. The transfer robot includes an anneal chamber 31 that accommodates the main part of the laser crystallization apparatus, a loader 32 for mounting of a cassette that contains a pre-treatment thin-film semiconductor substrate, an unloader 33 for mounting of a cassette that contains a post-treatment thin-film semiconductor substrate, and a transfer arm 34 that transfers a pre-treatment thin-film semiconductor substrate from the loader into the laser crystallization apparatus and transfers the post-treatment thin-film semiconductor substrate from laser crystallization apparatus into the unloader 33.

Figure 51:
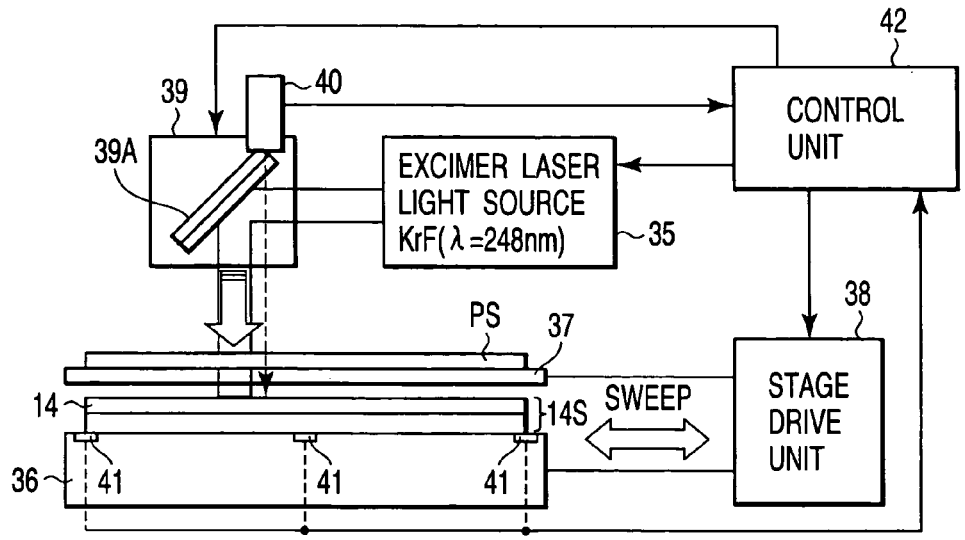
FIG. 51 shows the structure of the laser crystallization apparatus that is accommodated in an anneal chamber shown in FIG. 50.

FIG. 51 shows the structure of the laser crystallization apparatus. The laser crystallization apparatus includes an excimer laser light source 35, a substrate stage 36, a mask stage 37, a stage drive unit 38, a scanning optical system 39, a detection unit 40 for alignment, a substrate detection section 41 and a control unit 42. The excimer laser light source 35 is disposed outside the anneal chamber 31 and generates a KrF excimer laser beam with a wavelength $\lambda=248$ nm. The excimer laser beam is guided from the excimer laser light source 35 to the inside of the anneal chamber 31. In the anneal chamber 31, the substrate stage 36, on which a thin-film semiconductor substrate 14S is mounted, is movable in a horizontal two-dimensional plane. The mask stage 37 is disposed above the substrate stage 36. On the mask stage 37, the phase shifter PS is mounted. The mask stage 37 is movable in a horizontal two-dimensional plane. The mask stage 37 is configured to contact only the outer edge of the phase shifter PS in order not to shade the excimer laser beam that passes through the phase shifter PS. The stage drive unit 38 adjusts the positions of the substrate stage 36 and mask stage 37 and sweeps the substrate 36 and mask stage 37 in the length direction of the thin-film semiconductor substrate 14S. The scanning optical system 39 alters the direction of radiation of the excimer laser beam from the excimer laser light source 35 by means of a mirror 39A and makes the beam incident on the thin-film semiconductor substrate 14S through the phase shift pattern SP of the phase shifter PS. The thin-film semiconductor substrate 14S is scanned in its width direction by the excimer laser beam from the scanning optical system 39. The detection unit 40 for alignment is an optical area sensor that detects the state of alignment between the reticle pattern RP on the phase shifter PS side and the alignment mark MK on the thin-film semiconductor substrate side. The substrate detection section 41 comprises a plurality of optical sensors that are buried in the substrate stage 36 so as to be exposed on the surface in order to detect the state of the thin-film semiconductor substrate 14S that is placed on the substrate stage 36 by the transfer arm 34. Based on signals from the substrate detection section 41 and detection section 40 for alignment, the control unit 42 controls the stage drive unit 38, scanning optical system 39 and excimer laser light source 35. Although not shown in FIG. 51, the substrate stage 36 and mask stage 37 include inclination adjusting mechanisms that are driven by the stage drive unit 38 in accordance with the control by the control unit 42 and set the thin-film semiconductor substrate 14S and phase shifter PS in the substantially horizontal position.

Figure 52:
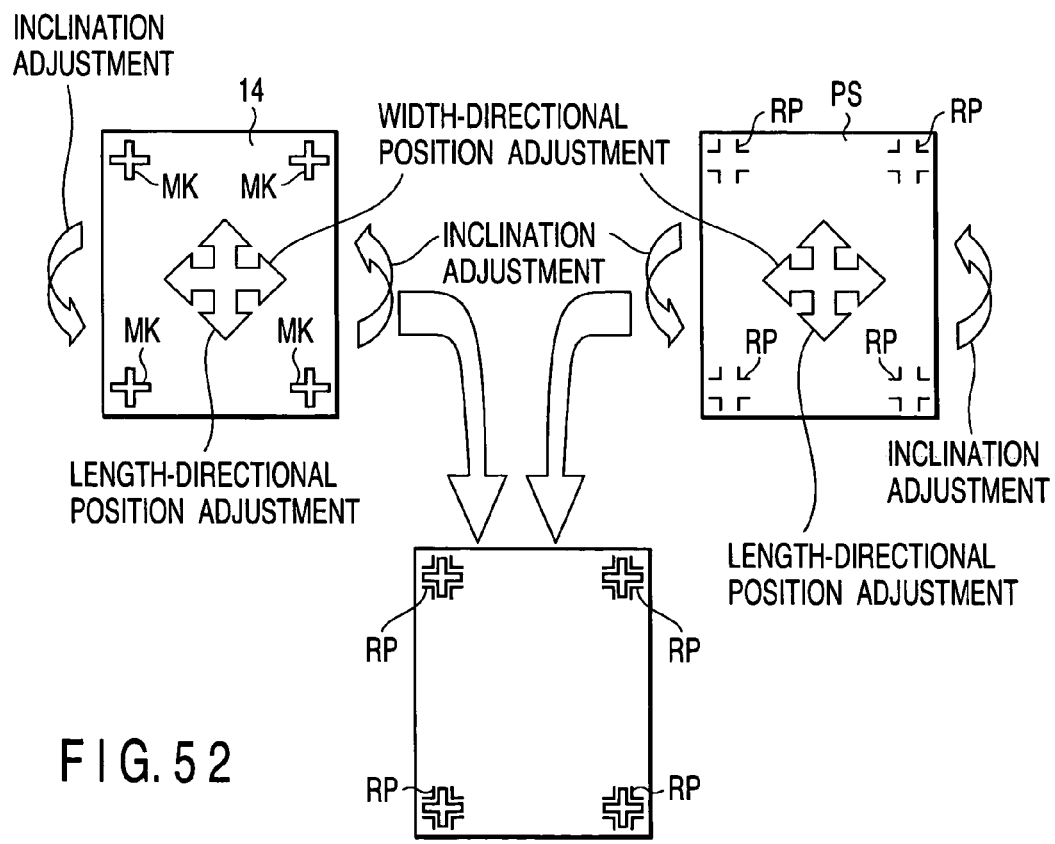
FIG. 52 is a view that illustrates the operation of a stage drive unit shown in FIG. 51.

Next, the operation of the laser crystallization apparatus is described. If the thin-film semiconductor substrate 14S is mounted on the substrate stage 36 by the transfer arm 34, the state of mounting of the thin-film semiconductor substrate 14S is informed to the control unit 42 from the substrate detection section 41. Accordingly, the control unit 42 controls the stage drive unit 38. By this control, the stage drive unit 38 moves the substrate stage 36 such that the thin-film semiconductor substrate 14S is substantially opposed to the phase shifter PS. In this case, the control unit 42 controls the stage drive unit 38, and the stage drive unit 38 sweeps the substrate stage 36 and mask stage 37 in the length direction of the thin-film semiconductor substrate 14S so as to cross the detection unit 40 for alignment. During this time, the control unit 42 controls the stage drive unit 38, referring to the state of alignment between the alignment marks MK and reticle patterns RP, which is detected by the detection unit 40 for alignment. In this control, as shown in FIG. 52, the stage drive unit 38 adjusts the position of the substrate stage 36 such that the alignment marks MK are set at the centers of the associated reticle patterns RP. If the alignment mark MK or reticle pattern RP is distorted, the inclination adjusting mechanism corrects the inclination of the thin-film semiconductor substrate 14S or phase shifter PS. If the adjustment of the state of alignment between the phase shifter PS and thin-film semiconductor substrate 14S is completed, the control unit 42 controls the excimer laser light source 35 and scanning optical system 39. Thereby, the excimer laser beam is applied to the semiconductor thin film 14 of the thin-film semiconductor substrate 14S through the phase shift pattern SP of the phase shifter PS. In addition, the control unit 42 controls the stage drive unit 38, thereby to sweep the substrate stage 36 and mask stage 37 in the length direction of the thin-film semiconductor substrate 14S so as to cross the scanning optical system 39. Thus, the semiconductor thin film 14 is crystallized, as described in connection with the preceding embodiments.

In the laser crystallization apparatus of this embodiment, the excimer laser light source 35 and scanning optical system 39 constitute the laser irradiation section that applies the laser beam to the semiconductor thin film 14 through the phase shifter PS, which is fixed at the reference position for crystallization indicated by the alignment marks. Hence, in the crystallization, like the sixth embodiment, large-size single-crystal semiconductor grains, which are set in a predetermined positional relationship with the alignment marks MK, can be formed in the semiconductor thin film 14. Therefore, the alignment marks MK can be used in order to form, with high reliability, the semiconductor active devices such as polysilicon TFTs within the regions of the large-size single-crystal semiconductor grains.

Figure 53:
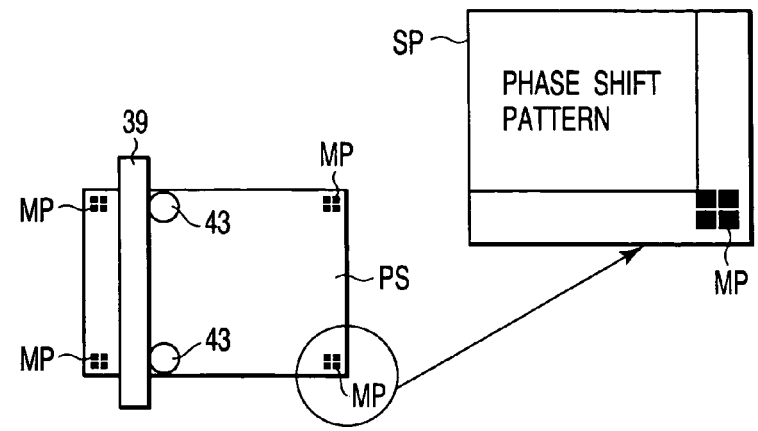
FIG. 53 shows a plan-view disposition of a pair of laser processing units that are provided in a laser crystallization apparatus according to a seventh embodiment of the present invention.

A laser crystallization apparatus according to a seventh embodiment of the present invention will now be described referring to the accompanying drawings. The laser crystallization apparatus is used to perform a laser annealing process on the thin-film semiconductor substrate 14S that is obtained during the manufacture of the thin-film semiconductor device according to the fourth embodiment. The structure of the seventh embodiment is similar to that of the sixth embodiment except that the detection unit 40 for alignment shown in FIG. 51 is replaced with a pair of laser processing units 43 shown in FIG. 53, and the configuration of the control unit 42 is altered. In FIG. 53, the parts common to those in the sixth embodiment are denoted by like reference numerals, and a description thereof is omitted or simplified.

The paired laser processing units 43 are arranged in the width direction of the phase shifter PS, as shown in FIG. 44, such that they adjoin the scanning optical system 39. The laser processing units 43 apply trimming laser beams to the marking patterns MK that are disposed near end portions of the phase shifter PS. The configuration of the control unit 42 is altered to execute the control described below.

If the thin-film semiconductor substrate 14S is mounted on the substrate stage 36 by the transfer arm 34, the state of mounting of the thin-film semiconductor substrate 14S is informed to the control unit 42 from the substrate detection section 41. Accordingly, the control unit 42 controls the stage drive unit 38. By this control, the stage drive unit 38 moves the substrate stage 36 such that the thin-film semiconductor substrate 14S is substantially opposed to the phase shifter PS. Then, the control unit 42 controls the laser processing units 43, thereby to apply the excimer laser beam for trimming to the semiconductor thin film 14 of the thin-film semiconductor substrate 14S through the marking patterns MP of the phase shifter PS. In addition, the control unit 42 controls the stage drive unit 38, thereby to sweep the substrate stage 36 and mask stage 37 in the length direction of the thin-film semiconductor substrate 14S so as to cross the laser processing units 43. Thus, the alignment marks MK as shown in FIG. 45 are formed.

Thereafter, with the positional relationship between the thin-film semiconductor substrate 14S and phase shifter PS being maintained, the control section 42 controls the excimer laser light source 35 and scanning optical system 39. Thereby, the excimer laser beam is applied to the semiconductor thin film 14 of the thin-film semiconductor substrate 14S through the phase shift pattern SP of the phase shifter PS. In addition, the control unit 42 controls the stage drive unit 38, thereby to sweep the substrate stage 36 and mask stage 37 in the length direction of the thin-film semiconductor substrate 14S so as to cross the scanning optical system 39. Thus, the semiconductor thin film 14 is crystallized, as described in connection with the fourth embodiment.

In the laser crystallization apparatus of this embodiment, the excimer laser light source 35 and scanning optical system 39 constitute the laser irradiation section that applies the laser beam to the semiconductor thin film 14 through the phase shifter PS, which is fixed at the reference position for crystallization. Hence, in the crystallization, like the sixth embodiment, large-size single-crystal semiconductor grains, which are set in a predetermined positional relationship with the alignment marks MK, can be formed in the semiconductor thin film 14. Therefore, the alignment marks MK can be used in order to form, with high reliability, the semiconductor active devices such as polysilicon TFTs within the regions of the large-size single-crystal semiconductor grains.

In particular, in the present embodiment, the laser beams for trimming are applied from the laser processing units 43 to the semiconductor thin film 14 through the marking patterns MP of the phase shifter PS. In addition, in the laser annealing process, the excimer laser beam is applied from the laser irradiation section to the semiconductor thin film 14 through the phase shift pattern SP of the phase shifter PS. Since the phase shift patterns SP and marking patterns MP are fixed in the predetermined positional relationship on the phase shifter PS, the thin-film semiconductor substrate 14S is disposed to face the phase shifter PS by rough positioning. With this state maintained, the laser trimming process and the laser annealing process are performed. In short, precise alignment between the thin-film semiconductor substrate 14S and the phase shifter PS is not required to keep a predetermined positional relationship between the alignment marks MK and the large-size single-crystal silicon grains, which are to be formed in the semiconductor thin film 14.

Figure 54:
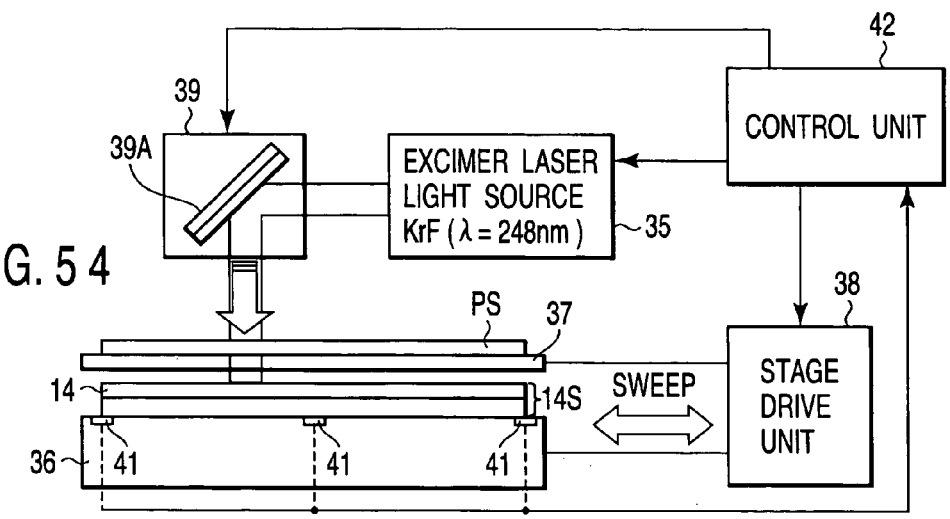
FIG. 54 shows the structure of a laser crystallization apparatus according to an eighth embodiment of the invention.

A laser crystallization apparatus according to an eighth embodiment of the present invention will now be described referring to the accompanying drawings. The laser crystallization apparatus is used to perform a laser anneal process on the thin-film semiconductor substrate 14S that is obtained during the manufacture of the thin-film semiconductor device according to the fifth embodiment. The structure of the eighth embodiment is similar to that of the sixth embodiment except that the detection unit 40 for alignment shown in FIG. 51 is dispensed with, as shown in FIG. 54, and the configuration of the control unit 42 is altered. In FIG. 54, the parts common to those in the sixth embodiment are denoted by like reference numerals, and a description thereof is omitted or simplified.

The configuration of the control unit 42 is altered to execute the following control. If the thin-film semiconductor substrate 14S is mounted on the substrate stage 36 by the transfer arm 34, the state of mounting of the thin-film semiconductor substrate 14S is informed to the control unit 42 from the substrate detection section 41. Accordingly, the control unit 42 controls the stage drive unit 38. By this control, the stage drive unit 38 moves the substrate stage 36 such that the thin-film semiconductor substrate 14S is substantially opposed to the phase shifter PS.

Thereafter, with the positional relationship between the thin-film semiconductor substrate 14S and phase shifter being maintained, the control section 42 controls the excimer laser light source 35 and scanning optical system 39. Thereby, the excimer laser beam is applied to the semiconductor thin film 14 of the thin-film semiconductor substrate 14S through the marking patterns MP and phase shift pattern SP of the phase shifter PS. In addition, the control unit 42 controls the stage drive unit 38, thereby to sweep the substrate stage 36 and mask stage 37 in the length direction of the thin-film semiconductor substrate 14S so as to cross the scanning optical system 39. Thus, the semiconductor thin film 14 is crystallized and the alignment marks MK are formed, as described in connection with the fifth embodiment.

In the laser crystallization apparatus of this embodiment, the excimer laser light source 35 and scanning optical system 39 constitute the laser irradiation section that applies the laser beam to the semiconductor thin film 14 through the phase shifter PS, which is fixed at the reference position for crystallization. Hence, in the crystallization, like the sixth embodiment, large-size single-crystal semiconductor grains, which are set in a predetermined positional relationship with the alignment marks MK, can be formed in the semiconductor thin film 14. Therefore, the alignment marks MK can be used in order to form, with high reliability, the semiconductor active devices such as polysilicon TFTs within the regions of the large-size single-crystal semiconductor grains.

In particular, in the present embodiment, in the laser annealing process, the laser beam is applied from the laser irradiation section to the semiconductor thin film 14 through the marking patterns MP and phase shift pattern SP of the phase shifter PS. Since the phase shift pattern SP and marking patterns MP are fixed in the predetermined positional relationship on the phase shifter PS, the thin-film semiconductor substrate 14S is disposed to face the phase shifter PS by rough positioning. With this state maintained, the laser annealing process is performed. In short, precise alignment between the thin-film semiconductor substrate 14S and the phase shifter PS is not required to keep a predetermined positional relationship between the alignment marks MK and the large-size single-crystal silicon grains, which are to be formed in the semiconductor thin film 14. In this case, the laser trimming process, which is performed using the laser processing units 43 in the seventh embodiment, is needless.

The present invention is not limited to the above-described embodiments, and various modifications can be made without departing from the spirit of the invention.

In the above-described embodiments, the laser crystallization apparatuses are of the scan type. However, the invention is also applicable to a stepper-type laser crystallization apparatus, which is generally used, for example, in the case of forming a plurality of active matrix liquid crystal displays on a single thin-film semiconductor substrate 14S. In this case, the excimer laser beam is applied to a part of the thin-film semiconductor substrate 14S, which is divided in accordance with the number of liquid crystal display devices, through the phase shift pattern SP of the phase shifter PS or through the entirety of the phase shift pattern SP and marking patterns MP of the phase shifter PS.

Assume that either a scan-type laser crystallization apparatus or a stepper-type laser crystallization apparatus is used to crystallize a thin-film semiconductor substrate 14S comprising, e.g. four divisional regions. In this case, nine alignment marks MK, for instance, are arranged, as shown in portion (A) of FIG. 55. If each alignment mark MK has a shape as shown in portion (B) of FIG. 55, a reticle pattern RP as shown in portion (C) of FIG. 55 is overlapped with the alignment mark MK, thereby determining the mask position in the case of crystallizing the semiconductor thin film 14 or the mask position in the case of forming the semiconductor active device in the semiconductor thin film 14.

Figure 56:
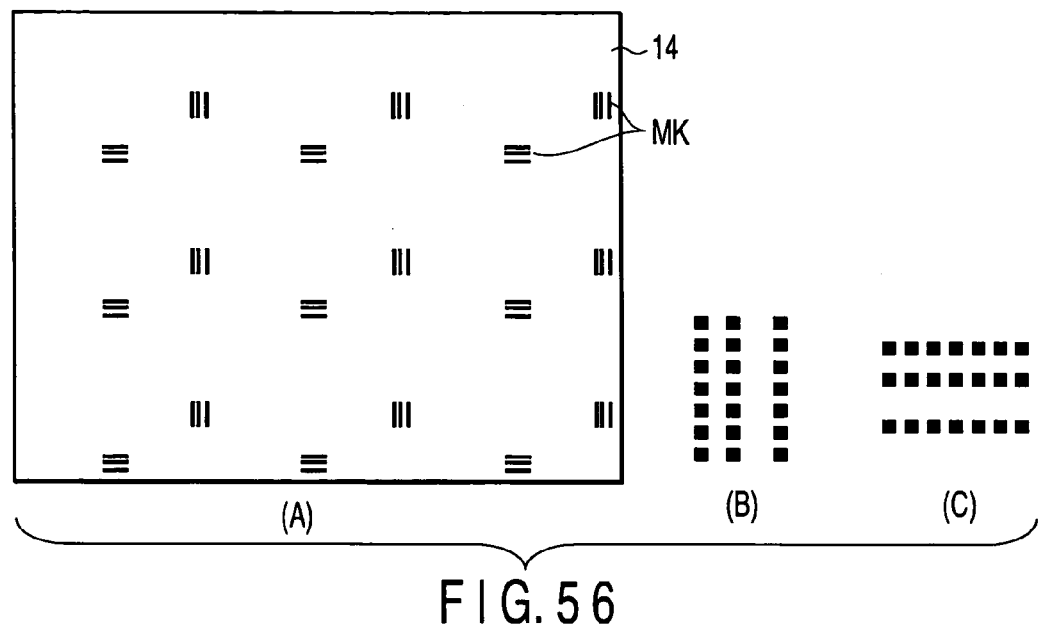
FIG. 56 shows a modification of the arrangement and shapes of the alignment marks shown in FIG. 55.

Alternatively, 18 alignment marks MK may be arranged on the thin-film semiconductor substrate 14S comprising nine divisional regions, as shown in portion (A) of FIG. 56. In this case, two alignment marks MK are disposed on each divisional region in directions indicated in portions (B) and (C) of FIG. 56.

Figure 55:
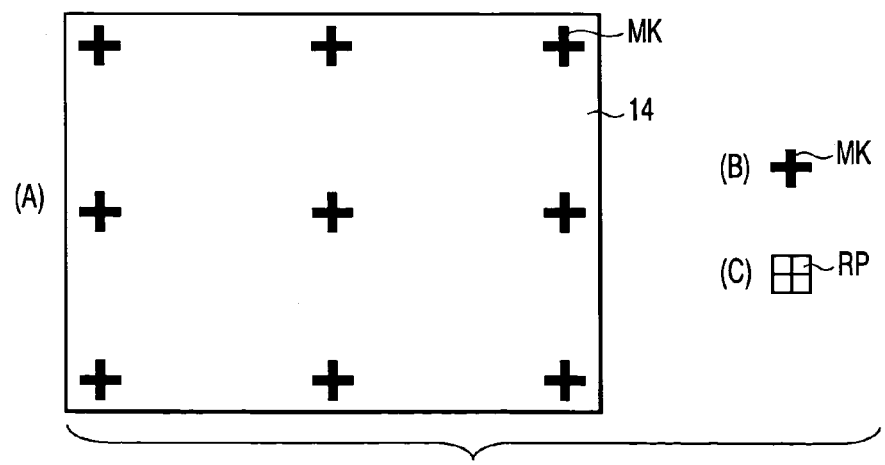
FIG. 55 is a view for describing the arrangement and shapes of alignment marks that are used in a case where a thin-film semiconductor substrate comprises, e.g. nine divisional regions.
Figure 57:
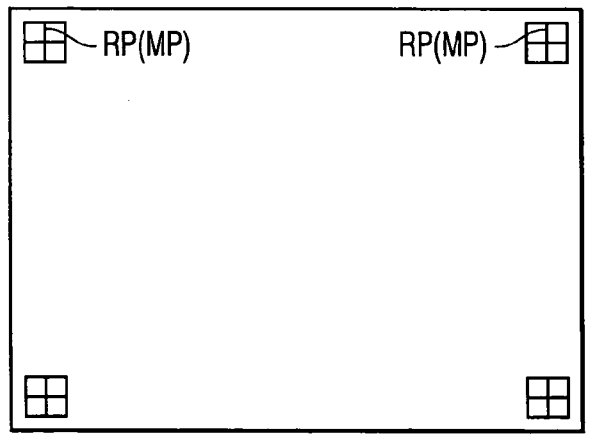
FIG. 57 shows a first example of shapes and arrangement of reticle patterns or marking patterns that are provided on a phase shifter for crystallization or a photomask for photolithography.

In the case where the plural alignment marks MK are arranged as shown in FIG. 55, the reticle patterns RP or marking patterns MP of the phase shifter PS may be shaped and arranged as shown in FIG. 57. Furthermore, if the same reticle patterns are provided on the photomask that is used in the photolithography for forming the semiconductor active device in the semiconductor thin film 14, the photomask and the thin-film semiconductor substrate 14S can exactly be aligned with reference to the alignment marks MK.

Figure 58:
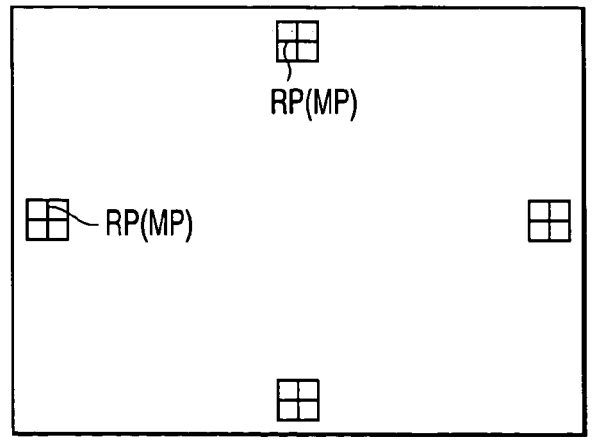
FIG. 58 shows a second example of shapes and arrangement of reticle patterns or marking patterns that are provided on the phase shifter for crystallization or the photomask for photolithography.

Alternatively, the reticle patterns RP or marking patterns MP may be shaped and arranged as shown in FIG. 58.

The reticle patterns RP or marking patterns MP, as shown in FIGS. 57 and 58, may also be used to detect the positional relationship between the mask stage 37 and the phase shifter PS, which is used for the laser annealing process for crystallizing the semiconductor thin film 14, or the photomask for the photolithography for forming the semiconductor active device in the semiconductor thin film 14.

In the above-described embodiments, the state of alignment is adjusted such that the alignment marks MK are set at the centers of the associated reticle patterns RP. Alternatively, as shown in FIG. 59, for example, a plurality of position sensors 44 may be buried in the substrate stage 36 and mask stage 37. Ultraviolet light may be radiated on a predetermined range including the alignment marks MK and reticle patterns RP, thereby independently detecting the positions of the alignment marks MK and reticle patterns RP. The state of alignment may thus be adjusted. In addition, the position of the thin-film semiconductor substrate 14S or the exact position of the phase shifter PS or the photomask can be confirmed if the control unit 42 performs arithmetic operations, based on, e.g. a method of least-squares, for coordinates positions obtained on the basis of signals from the position sensors 44.

In the case where a laser crystallization apparatus is of a projection type as shown in, e.g. FIG. 60, the phase shifter PS is disposed, for example, between the mirror 39A and excimer laser light source 35. In this case, a stage position determining pattern STP is added to the phase shifter PS, as shown in FIG. 61. A light-receiving member 45 is disposed on the stage 36, and a beam sensor 46 is attached to the back side of the light-receiving member 45. The beam sensor 46 is connected to a beam intensity measuring device 47. In this structure, the two-dimensional coordinates position (x, y) of the thin-film semiconductor substrate 14S is measured in advance by the position sensors 44. Subsequently, the excimer laser beam is applied to the light-receiving member 45 through the stage position determining pattern STP. The beam intensity measuring device 47 measures the two-dimensional coordinates position (a, b) of the stage position determining pattern STP, on the basis of a signal obtained from the beam sensor 46. The control unit 42 shown in FIG. 51 or 54 determines the position of the substrate stage 36, based on the positional relationship between the coordinates position (a, b) and the coordinates position (x, y).

In the above-described embodiments, the KrF excimer laser beam ($\lambda$=248 nm) is used as an energy beam. Alternatively, for instance, XeCl ($\lambda$=308 nm), XeF ($\lambda$=351 nm), or ArF ($\lambda$=193 nm) is usable.

In the above-described embodiments, the polysilicon TFT is formed using the semiconductor thin film 14. Alternatively, semiconductor active devices other than the polysilicon TFT, such as a MIS device, a bipolar transistor and a diode, may be formed using the semiconductor thin film 14.

Figure 63:
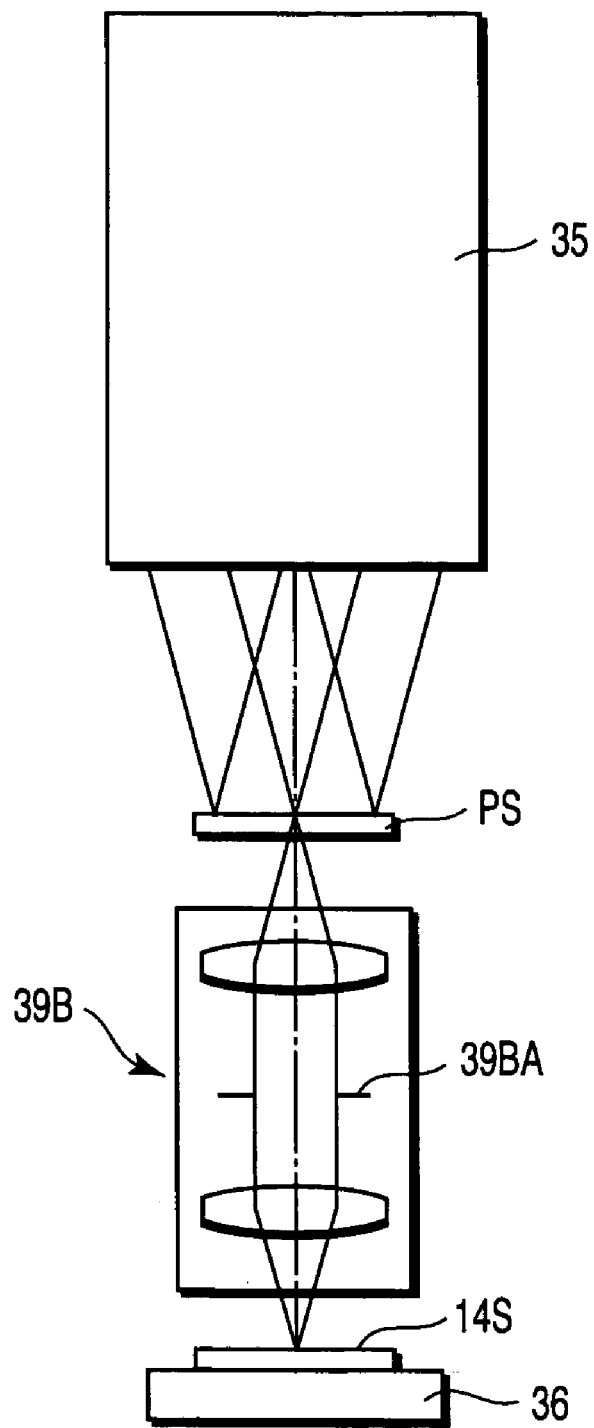
FIG. 63 is a view for describing a projection-type laser crystallization apparatus available instead of that shown in FIG. 60.

Further, the laser crystallization apparatus may have a structure shown in FIG. 63. In this apparatus, the optical imaging system 39B is disposed between the phase shifter PS and thin-film semiconductor substrate 14S to locate the phase shifter PS and thin-film semiconductor substrate 14S at the optically conjugated positions. That is, the thin-film semiconductor substrate 14S is set in a plane optically conjugated with the phase shifter PS (image plane of the optical imaging system 39B). An aperture diaphragm unit 39BA is disposed in an iris plane of the optical imaging system 39B. The aperture diaphragm unit 39BA includes a plurality of aperture diaphragms different from one another in the size of the aperture (light transmission portion), and these aperture diaphragms can be changed with respect to an optical path. Instead, the aperture diaphragm unit 39BA may be formed of an iris diaphragm that can continuously change the size of the aperture. In any case, the size of the aperture of the aperture diaphragm unit 39BA (numerical aperture NA on the imaging side of the optical imaging system 39B) is set to obtain a required light intensity distribution of the inverse peak pattern on the semiconductor thin film 14 of the thin-film semiconductor substrate 14S. In addition, the optical imaging system 39B may be a refractive optical system, reflective optical system, or a refractive and reflective optical system.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of manufacturing a thin-film semiconductor substrate, comprising:

forming an insulating film on an insulative substrate;

forming a non-single crystal semiconductor film on said insulating film;

forming single crystal semiconductor grains in said non-single crystal semiconductor film by laser light applied through a phase-shift pattern which is provided to a phase shifter; and forming alignment marks in said non-single crystal semiconductor film by laser light applied through marking patterns which are provided to said phase shifter.

2. The method according to claim 1, wherein the laser light applied through the phase-shift pattern is generated from a laser light source for crystallization, and the laser light applied through the marking patterns is generated from a laser light source for trimming.

3. The method according to claim 1, wherein said alignment marks include an opening that is surrounded by said non-single crystal semiconductor film.

4. The method according to claim 1, wherein the laser light applied through said marking patterns and the laser light applied through said phase-shift pattern are generated from a laser light source for crystallization.

5. The method according to claim 4, wherein said alignment marks include a crystallized portion that is surrounded by a non-crystallized portion in said non-single crystal semiconductor film and distinguishable in color from the non-crystallized portion.

6. The method according to claim 1, wherein at least one of said alignment marks includes a plurality of straight lines that are perpendicular to each other.

7. The method according to claim 1, wherein said phase-shift pattern is formed to modulate an intensity of the laser light and provide a light intensity distribution that allows said non-single crystal semiconductor film to have a temperature gradient by which the single crystal semiconductor grains grow in a lateral direction from a low-temperature region to a high-temperature region.

8. The method according to claim 7, wherein said phase-shift pattern is formed in stripes to align the growth directions of the single crystal semiconductor grains.

9. The method according to claim 8, wherein the light intensity of the laser light applied through the phase-shift pattern is two-dimensionally measured by a beam profiler.

10. The method according to claim 1, which further comprises forming a semiconductor active device with an active part thereof being located within the single crystal semiconductor grain.

11. The method according to claim 10, wherein said non-single crystal semiconductor film is patterned using said alignment marks as a reference for the alignment between the active part and the single crystal semiconductor grain.

* * * * *